United States Patent [19]
Matsumoto et al.

[11] Patent Number: 6,021,148
[45] Date of Patent: Feb. 1, 2000

[54] SEMICONDUCTOR LASER DEVICE

[75] Inventors: Keisuke Matsumoto; Eitaro Ishimura; Kazuhisa Takagi, all of Tokyo, Japan

[73] Assignee: Mitsubishi Denki Kabushiki Kaisha, Tokyo, Japan

[21] Appl. No.: 08/925,742

[22] Filed: Sep. 9, 1997

[30] Foreign Application Priority Data

Jun. 3, 1997 [JP] Japan ................................. 9-145207

[51] Int. Cl.[7] ............................................. H01S 3/085
[52] U.S. Cl. .......................... 372/50; 372/45; 372/46; 372/26
[58] Field of Search ............................ 372/50, 45, 46, 372/26

[56] References Cited

U.S. PATENT DOCUMENTS

| | | | |
|---|---|---|---|
| 4,563,765 | 1/1986 | Tsang et al. | 372/50 |
| 4,759,023 | 7/1988 | Yamaguchi | 372/50 |
| 5,305,343 | 4/1994 | Allovon et al. | 372/50 |
| 5,481,559 | 1/1996 | Kawamura | 372/50 |

OTHER PUBLICATIONS

Aoki et al., "InGaAs/InGaAsP MOW Electroabsorption Modulator Integrated With A DFB Laser Fabricated by Band–Gap Energy Control Selective Area MOCVD", IEEE Journal of Quantum Electronics, vol. 29, No. 6, Jun. 1993, pp. 2088–2096.

Primary Examiner—James W. Davie
Attorney, Agent, or Firm—Leydig, Voit & Mayer, Ltd.

[57] ABSTRACT

A semiconductor laser device in which a semiconductor laser emitting laser light and a light modulator modulating the laser light are integrated on a compound semiconductor substrate, includes a hole trapping layer for suppressing a reactive current that is generated when the semiconductor laser is operated and that does not contribute to laser oscillation. The hole trapping layer has a first region in the semiconductor laser and a second region in the light modulator. The hole trapping layer has a high carrier concentration and a low resistance and is discontinuous between the semiconductor laser and the light modulator, so that isolation between the laser and the modulator is increased, whereby a high-frequency signal applied to the light modulator is prevented from flowing through the hole trapping layer into the laser. Therefore, even when long-distance transmission is carried out using the semiconductor laser device, deterioration of transmitted wave is suppressed, resulting in satisfactory transmission characteristics.

6 Claims, 40 Drawing Sheets dry etching

SEMICONDUCTOR LASER DEVICE

FIELD OF THE INVENTION

The present invention relates to a semiconductor laser device integrated with a light modulator, capable of high-speed operation, used as a transmitter in optical communication. More specifically, the invention relates to such a semiconductor laser device having a structure for increasing the isolation between a semiconductor laser and a modulator. The invention also relates to a method for fabricating the semiconductor laser device.

BACKGROUND OF THE INVENTION

In recent years, semiconductor laser devices in which semiconductor lasers and modulators are integrated have been developed for application to optical communication. For example, a distributed feedback laser diode (hereinafter referred to as a DFB-LD) is dc-operated and laser light emitted from the DFB-LD is subjected to high-speed modulation in a light absorption modulator.

By the way, since a semiconductor laser is a forward biased device while a modulator is a reverse biased device, it is necessary to secure sufficient electrical isolation between the semiconductor laser and the modulator. Generally, in a semiconductor laser, its oscillation wavelength varies as the injection current is varied. In a semiconductor laser integrated with a modulator, though the laser is operated with a constant current, a modulation signal applied to the modulator and, through the isolation resistance, undesirably varies the current flowing toward the laser, whereby the oscillation wavelength of the laser varies. Because of the wavelength variation, the transmission waveform deteriorates during long-distance transmission through an optical fiber, so that the transmission distance is restricted. In order to improve transmission characteristics by solving the above problem, it is important to increase the isolation resistance.

FIG. 33(a) is a perspective view illustrating a semiconductor laser device integrated with a light modulator as a prior art semiconductor laser device (hereinafter referred to simply as a device L). FIGS. 33(b) and 33(c) are cross-sectional views taken along lines 33b—33b and 33c—33c of FIG. 33(a), respectively. In these figures, reference numeral 1 designates an n type InP substrate. The device L comprises a semiconductor laser (region I) having a diffraction grating (not shown) on a region of the semiconductor substrate 1 beneath an active layer 2, a modulator (region III), and an isolation part (region II) for separating the laser from the modulator. A mesa structure (optical waveguide) comprising the active layer 2, an n type InP cladding layer 1a, and a p type InP cladding layer 3 is disposed on the n type InP substrate 1. Fe-doped InP semi-insulating semiconductor layers 5 and n type InP hole trapping layers 6 are disposed on the n type InP substrate 1, contacting both sides of the mesa structure, i.e., the mesa structure is buried in these layers 5 and 6. A p type InP cladding layer 8 is disposed on the mesa structure and on the hole trapping layers 6. A p type InGaAs contact layer 9 is disposed on the cladding layer 8. An insulating film 10 and electrodes 11 are disposed on the contact layer 9.

In the device L so constructed, the laser (region I) has a diffraction grating under the active layer 2, and the diffraction grating enables the laser to produce stable single-wavelength light.

The active layer 2 of the laser (region I) and the active layer (light absorption layer) 2 of the modulator (region III) comprise a continuous InGaAs/InGaAsP multiple quantum well (MQW) layer. A difference in energies between the base level of the conduction band and the base level of the valence band in the quantum well layer is smaller in the laser than in the modulator. Therefore, when no bias voltage is applied to the modulator, light emitted from the laser is not absorbed by the active layer (light absorption layer) 2 of the modulator. However, when a reverse bias voltage is applied to the modulator, the laser light is absorbed by the active layer 2 due to the QCSE (Quantum Confined Stark Effect). That is, light emitted from the laser being dc-operated is modulated by varying a bias voltage applied to the modulator.

Further, the Fe doped InP semi-insulating semiconductor layer 5 and the n type InP hole trapping layer 6 are disposed on both sides of the optical waveguide structure comprising the active layer 2 and the upper and lower cladding layers 1a and 3, and these layers 5 and 6 serve as current blocking layers. Since Fe serves as a deep acceptor in InP, the Fe doped semi-insulating semiconductor layer 5 blocks electrons diffusing from the n type InP substrate 1. Further, the n type InP hole trapping layer 6 blocks holes diffusing from the p type InP cladding layer 8. Thereby, the threshold current of the laser is reduced and the efficiency of the laser is improved.

A method for fabricating the device L shown in FIGS. 33(a)–33(c) will be described using FIGS. 34(a)–34(c), 35(a)–35(c), and 36(a)–36(c).

Initially, a diffraction grating is produced in a region of the n type InP substrate 1 where the laser is to be fabricated. Thereafter, a cladding layer 1a, an active layer 2, and a cladding layer 3 are successively grown by crystal growth, preferably MOCVD (Metal Organic Chemical Vapor Deposition). Then, a stripe-shaped insulating film 4 having a width of 1~2 $\mu$gm is formed on the cladding layer 3. Using the insulating film 4 as a mask, the structure is subjected to dry etching to form a mesa having a height of 2~3 $\mu$m. This mesa structure M provides an optical waveguide.

Thereafter, as shown in FIGS. 35(a)~35(c), a semi-insulating semiconductor layer 5 and a hole trapping layer 6 are grown at both sides of the mesa structure M so that the mesa is buried in these layers 5 and 6. Further, as shown in FIGS. 36(a)–36(c), after removal of the insulating film 4, a cladding layer 8 and a contact layer 9 are grown by crystal growth. Next, as shown in FIGS. 33(a)–33(c), a portion of the contact layer 9 opposed to the isolation part (region II) is removed. The range of this removal is 10~50 $\mu$m along the longitudinal direction of the mesa structure M (33c—33c direction in FIG. 33(a)). Thereafter, an insulating film 10 is deposited, and portions of the insulating film 10, opposite regions where electrodes are to be produced, are removed. Finally, electrodes 11 are produced in contact with the contact layer 9, completing the device L shown in FIGS. 33(a)–33(c).

Although the waveguide (mesa structure M) of the device L is formed by dry etching, it may be formed by wet etching as shown in FIGS. 37(a)–37(c). FIGS. 38(a)–38(c), 39(a)–39(c), and 40(a)–40(c) are diagrams illustrating process steps for fabricating a device L in which wet etching is employed in formation of a waveguide. In this case, since isotropic etching is carried out when the waveguide is formed, the width of the insulating film 4 must be as wide as 5~8 $\mu$m. Process steps other than the formation of the waveguide are identical to those already described with respect to FIGS. 34(a)–34(c), 35(a)–35(c), and 36(a)–36(c) for the case of employing dry etching and, therefore, do not require repeated description.

As described above, in the device L, sufficient electrical isolation is needed between the semiconductor laser (region I) and the modulator (region III). In the prior art structure, however, a high-frequency signal applied to the modulator leaks into the laser through the hole trapping layer 6 having a high carrier concentration and a low resistance.

SUMMARY OF THE INVENTION

It is an object of the present invention to provide a semiconductor laser device in which a laser and a modulator are integrated, that can secure sufficient electrical isolation between the laser and the modulator.

It is another object of the present invention to provide a method for fabricating the semiconductor laser.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor laser device in which a semiconductor laser emitting laser light and a light modulator modulating the laser light are integrated on a compound semiconductor substrate, includes a hole trapping layer for suppressing a reactive current that is generated when the semiconductor laser is operated and that does not contribute to laser oscillation, and the hole trapping layer has a first region in the semiconductor laser and a second region in the light modulator separated from each other. Since the hole trapping layer having a high carrier concentration and a low resistance is discontinuous between the semiconductor laser and the light modulator, isolation resistance between the laser and the modulator is increased, whereby a high-frequency signal applied to the light modulator is prevented from flowing through the hole trapping layer into the laser. Therefore, even when a long-distance transmission is carried out using the semiconductor laser device, deterioration of transmitted wave is suppressed, resulting in satisfactory transmission characteristics.

According to a second aspect of the present invention, in the above-mentioned semiconductor laser device, the hole trapping layer is disposed on a semi-insulating semiconductor layer that reduces capacitance of the device with an intervening layer having a band gap wavelength longer than that of the hole trapping layer.

According to a third aspect of the present invention, in the above-mentioned semiconductor laser device, the hole trapping layer is disposed directly on a semi-insulating semiconductor layer that reduces capacitance of the device. Therefore, the light emitting efficiency is improved, resulting in a semiconductor laser device with high efficiency.

According to a fourth aspect of the present invention, in the above-mentioned semiconductor laser device, the semi-insulating semiconductor layer comprises InP, and the hole trapping layer comprises InAlAs that makes lattice match with the InP.

According to a fifth aspect of the present invention, in the above-mentioned semiconductor laser device, the semi-insulating semiconductor layer comprises InP, and the hole trapping layer comprises InGaAsP that makes lattice match with the InP.

According to a sixth aspect of the present invention, there is provided a method for fabricating a semiconductor laser device in which a semiconductor laser emitting laser light and a light modulator modulating the laser light are integrated on a compound semiconductor substrate, including a hole trapping layer for suppressing a reactive current that is generated when the semiconductor laser is operated and does not contribute to laser oscillation, and the method includes forming the hole trapping layer on the compound semiconductor substrate; and etching and removing a portion of the hole trapping layer at the boundary between a first region where the semiconductor laser is to be fabricated and a second region where the light modulator is to be fabricated, thereby separating the hole trapping layer in the first region from that in the second region. In a semiconductor laser device fabricated according to this method, since the hole trapping layer is discontinuous between the semiconductor laser and the light modulator, isolation resistance between the laser and the modulator is increased, whereby a high-frequency signal applied to the light modulator is prevented from flowing through the hole trapping layer into the laser. Therefore, even when a long-distance transmission is carried out using the semiconductor laser device, deterioration of transmitted wave is suppressed, resulting in satisfactory transmission characteristics.

According to a seventh aspect of the present invention, in the above-mentioned method, wet etching is employed for the selective etching of the hole trapping layer.

According to an eighth aspect of the present invention, in the above-mentioned method, dry etching is employed for the selective etching of the hole trapping layer.

According to a ninth aspect of the present invention, the above-mentioned method further includes forming an etch stopping layer before formation of the hole trapping layer. Therefore, when the hole trapping layer is subjected to etching, the etching process is accurately controlled by the etch stopping layer. As a result, a desired etching process is carried out with accuracy.

According to a tenth aspect of the present invention, there is provided a method for fabricating a semiconductor laser device in which a semiconductor laser emitting laser light and a light modulator modulating the laser light are integrated on a compound semiconductor substrate, including a hole trapping layer for suppressing a reactive current that is generated when the semiconductor laser is operated and does not contribute to laser oscillation, and the method includes selectively growing hole trapping layers on separated first and second areas on the compound semiconductor substrate, corresponding to a first region where the semiconductor layer is to be fabricated and a second region where the light modulator is to be fabricated, respectively. In a semiconductor laser device fabricated according to this method, since the hole trapping layer is discontinuous between the semiconductor laser and the light modulator, isolation resistance between the laser and the modulator is increased, whereby a high-frequency signal applied to the light modulator is prevented from flowing through the hole trapping layer into the laser. Therefore, even when a long-distance transmission is carried out using this semiconductor laser device, deterioration of transmitted wave is suppressed, resulting in satisfactory transmission characteristics.

According to an eleventh aspect of the present invention, in the above-mentioned method, vapor phase deposition is employed for the selective growth of the hole trapping layer.

DETAILED DESCRIPTION OF THE PREFERRED EMBODIMENTS

[Embodiment 1]

Figure 1:
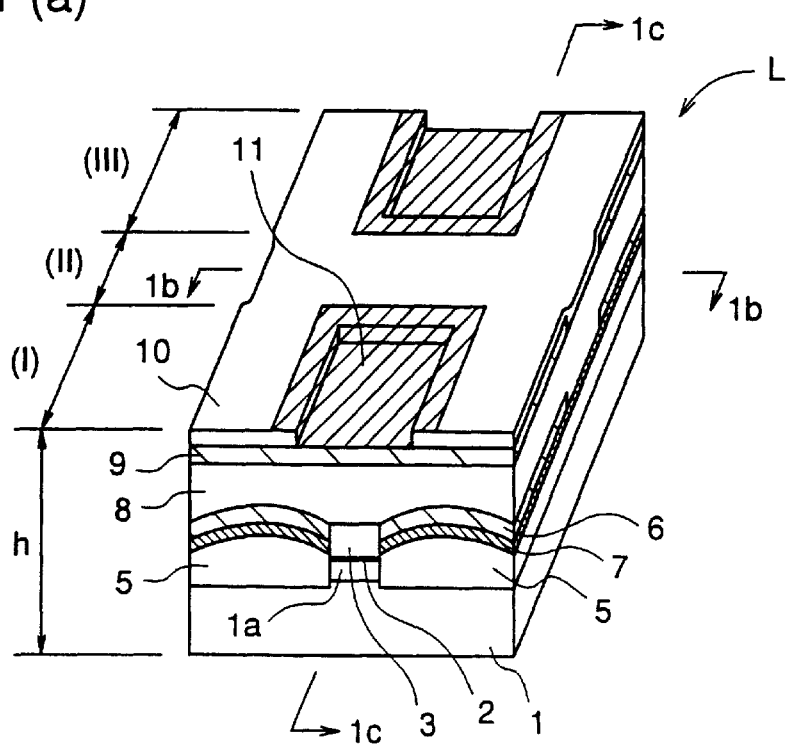
FIG. 1(a) is a perspective view illustrating a semiconductor laser device according to a first embodiment of the invention.
FIGS. 1(b) and 1(c) are cross-sectional views taken along lines 1b—1b and 1c—1c of FIG. 1(a), respectively.
Figure 1:
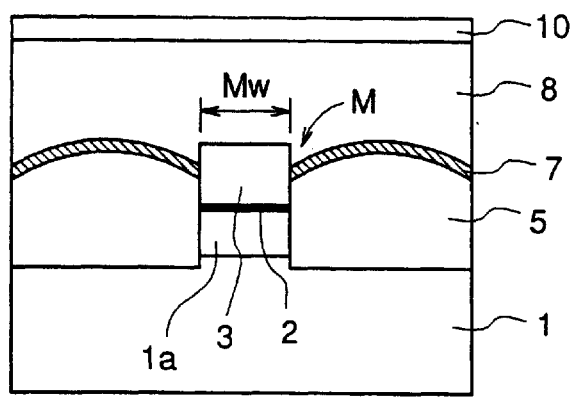
Figure 1:
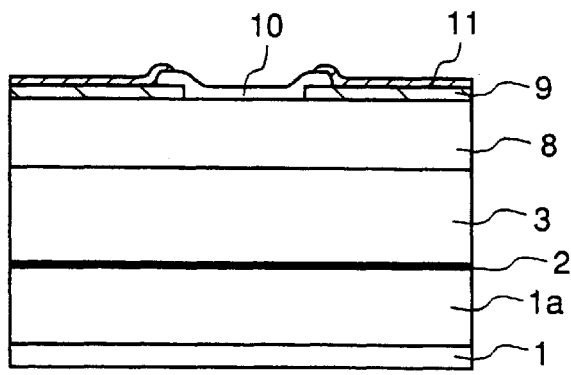

FIG. 1(a) is a perspective view illustrating a semiconductor laser device integrated with a modulator (hereinafter referred to simply as a device L) according to a first embodiment of the present invention, and FIGS. 1(a) and 1(b) are cross-sectional views taken along lines 1b—1b and 1c—1c of FIG. 1(a), respectively.

Figure 33:
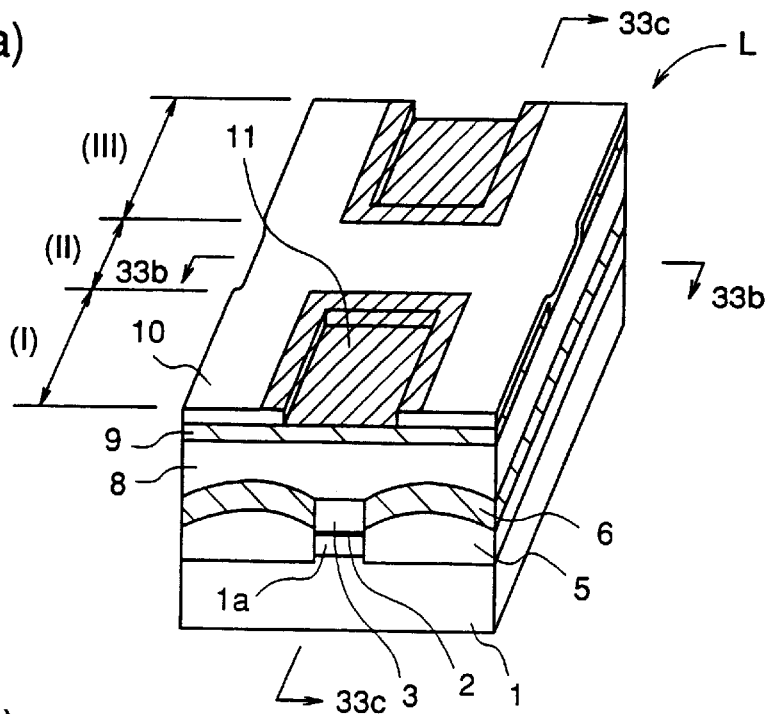
FIG. 33(a) is a perspective view illustrating a first semiconductor laser device according to a prior art.
FIGS. 33(b) and 33(c) are cross-sectional views taken along lines 33b—33b and 33c—33c of FIG. 33(a), respectively.
Figure 33:
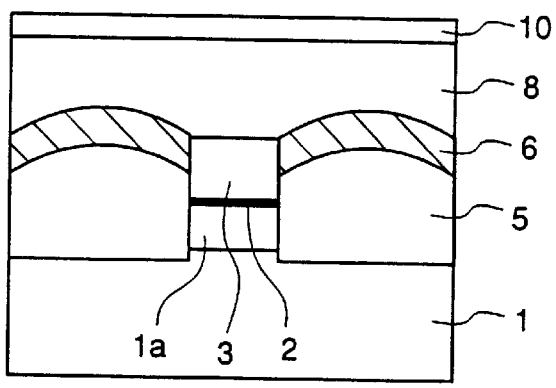
Figure 33:
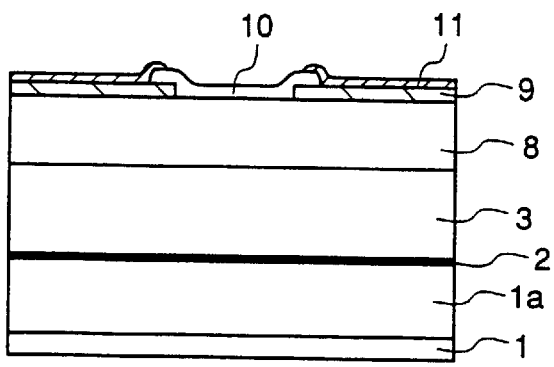
Figure 34:
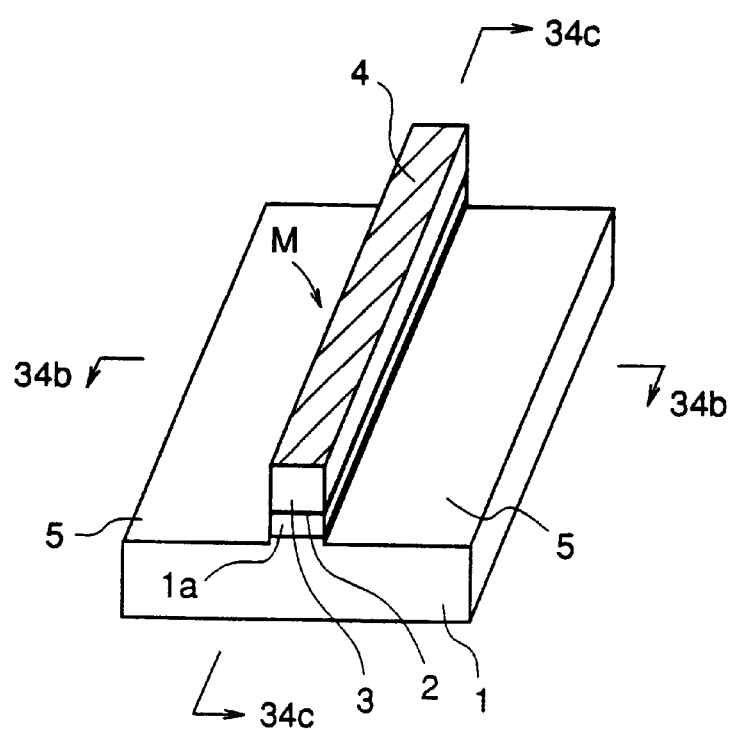
FIG. 34(a) is a perspective view illustrating a first step of a process for fabricating the first semiconductor laser device according to the prior art.
FIGS. 34(b) and 34(c) are cross-sectional views taken along lines 34b—34b and 34c—34c of FIG. 34(a), respectively.
Figure 34:
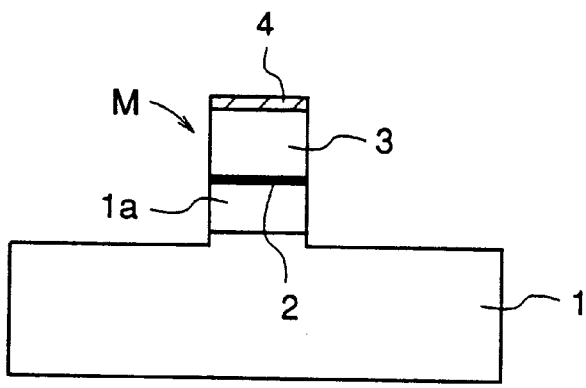
Figure 34:
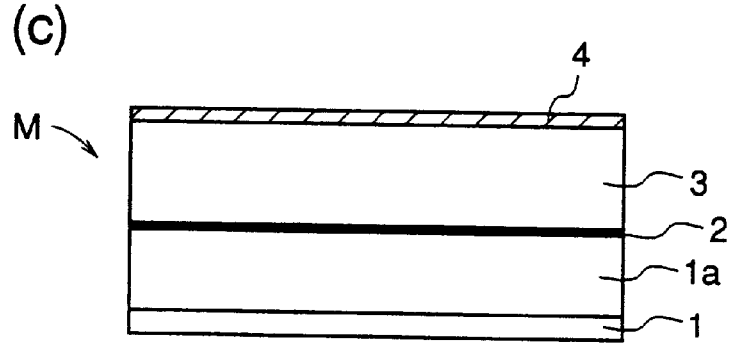
Figure 35:
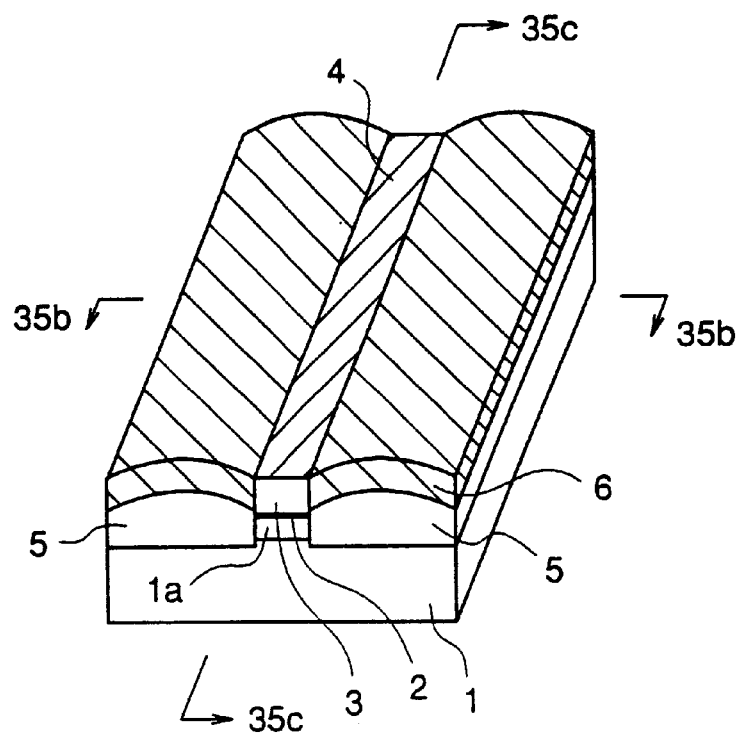
FIG. 35(a) is a perspective view illustrating a second step of the process for fabricating the first semiconductor laser device according to the prior art.
FIGS. 35(b) and 35(c) are cross-sectional views taken along lines 35b—35b and 35c—35c of FIG. 35(a), respectively.
Figure 35:
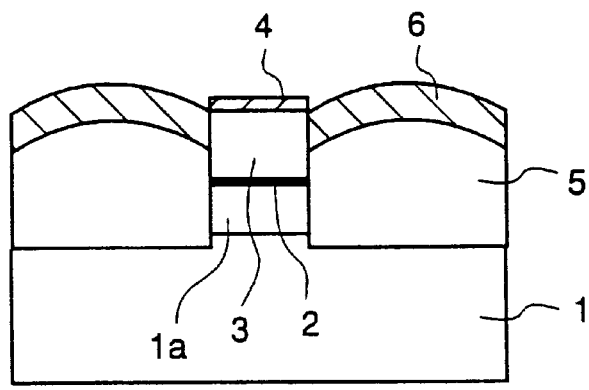
Figure 35:
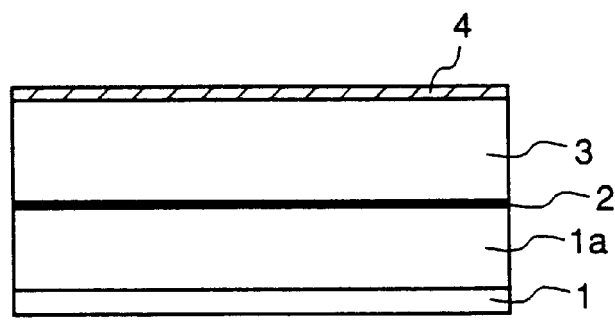
Figure 36:
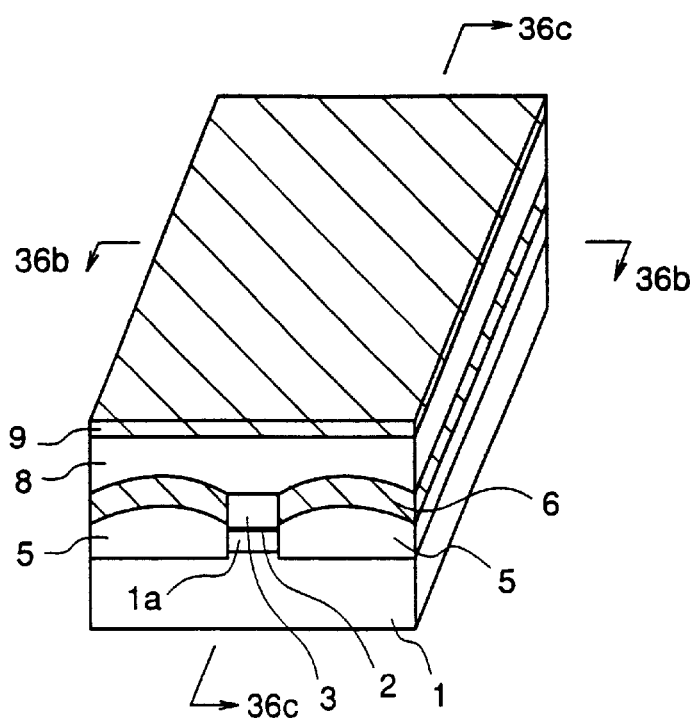
FIG. 36(a) is a perspective view illustrating a third step of the process for fabricating the first semiconductor laser device according to the prior art.
FIGS. 36(b) and 36(c) are cross-sectional views taken along lines 36b—36b and 36c—36c of FIG. 36(a), respectively.
Figure 36:
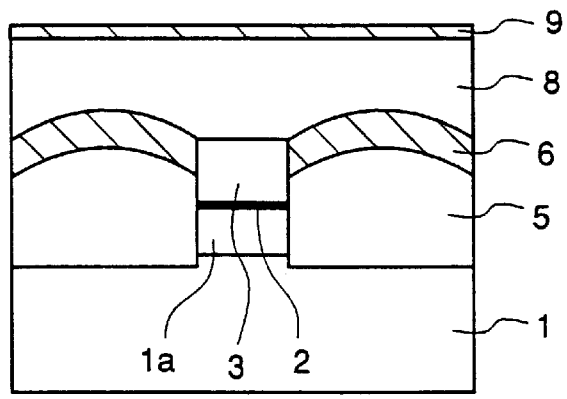
Figure 36:
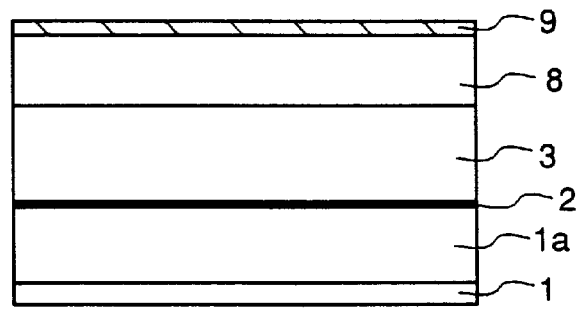
Figure 37:
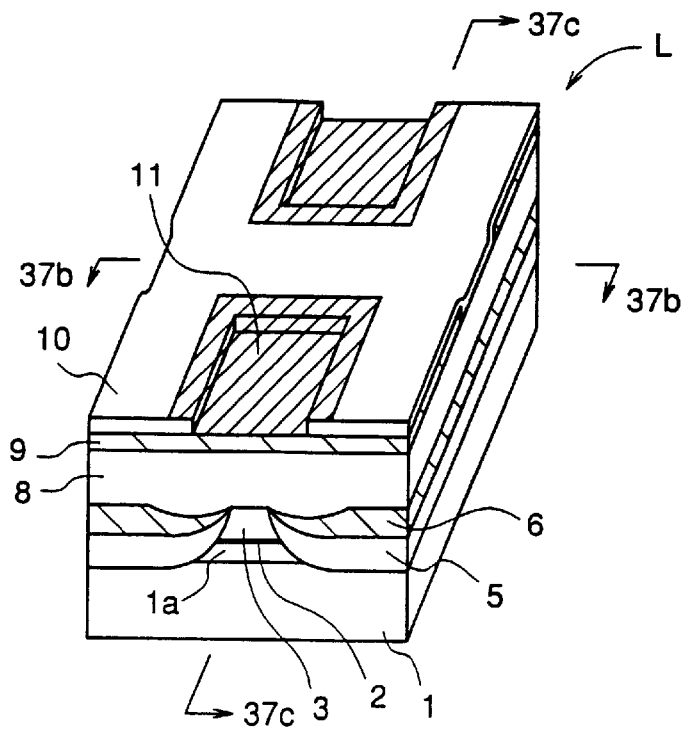
FIG. 37(a) is a perspective view illustrating a second semiconductor laser device according to the prior art.
FIGS. 37(b) and 37(c) are cross-sectional views taken along lines 37b—37b and 37c—37c of FIG. 37(a), respectively.
Figure 37:
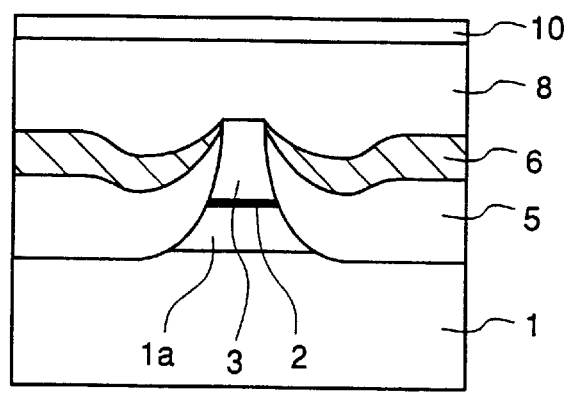
Figure 37:
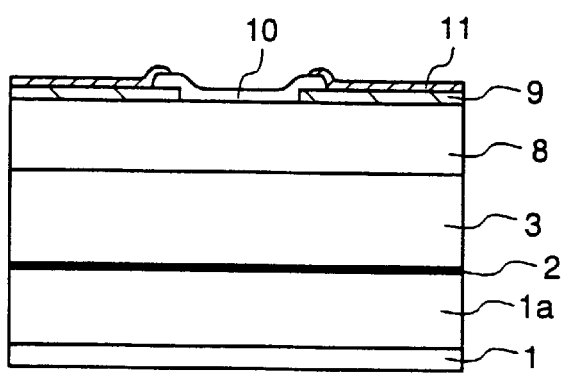
Figure 38:
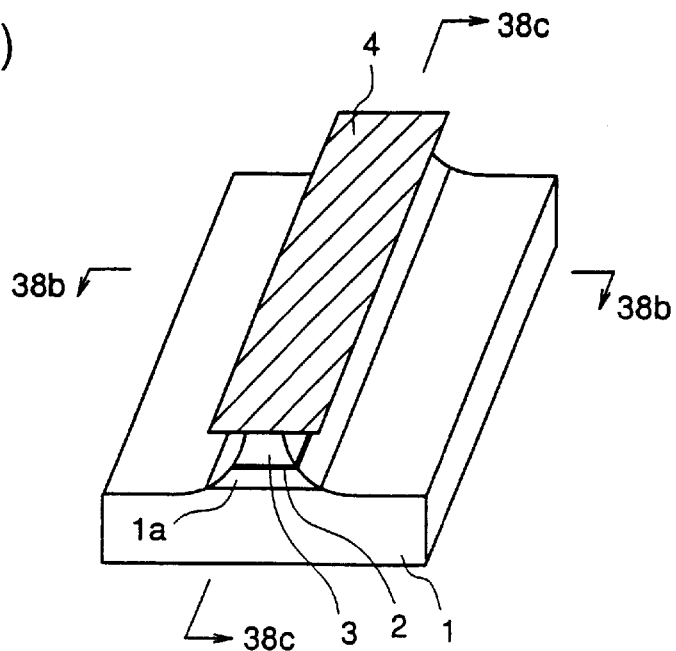
FIG. 38(a) is a perspective view illustrating a first step of a process for fabricating the second semiconductor laser device according to the prior art.
FIGS. 38(b) and 38(c) are cross-sectional views taken along lines 38b—38b and 38c—38c of FIG. 38(a), respectively.
Figure 38:
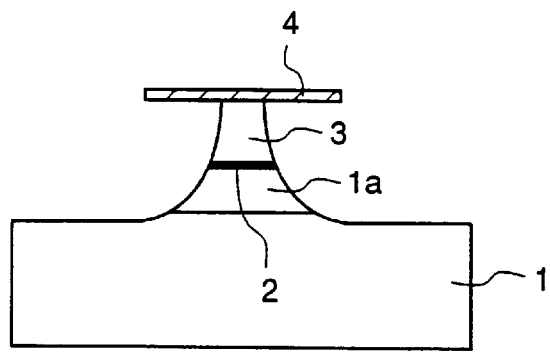
Figure 38:
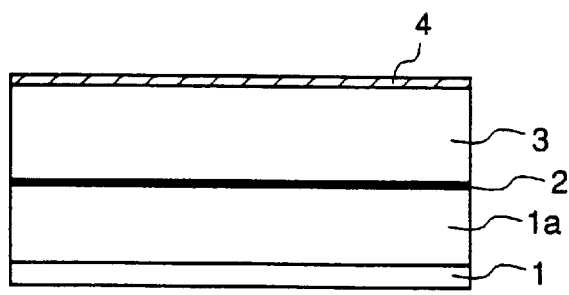
Figure 39:
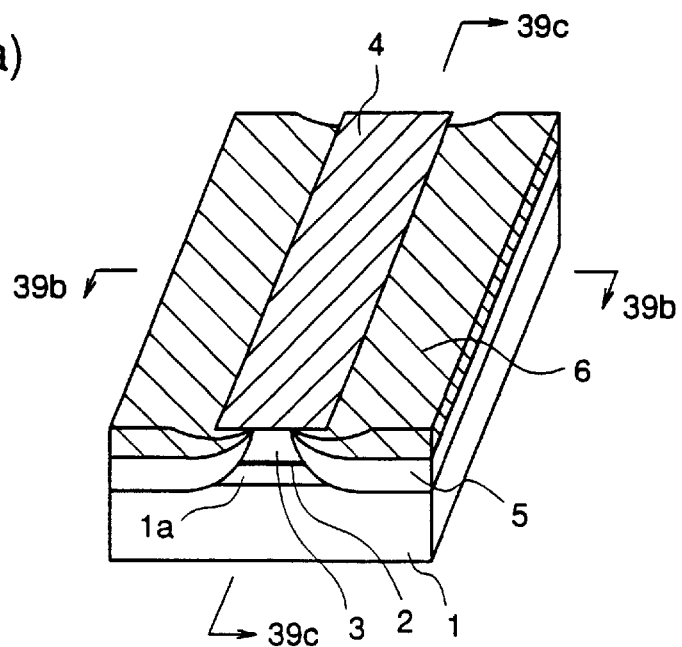
FIG. 39(a) is a perspective view illustrating a second step of the process for fabricating the second semiconductor laser device according to the prior art.
FIGS. 39(b) and 39(c) are cross-sectional views taken along lines 39b—39b and 39c—39c of FIG. 39(a), respectively.
Figure 39:
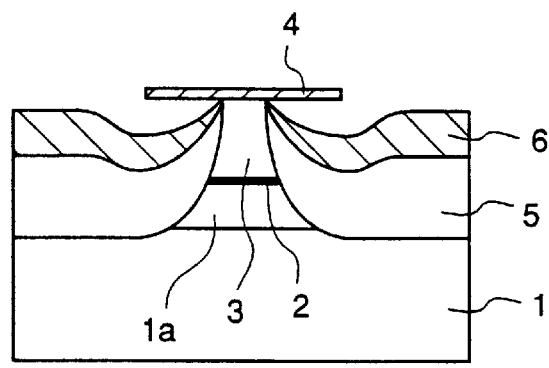
Figure 39:
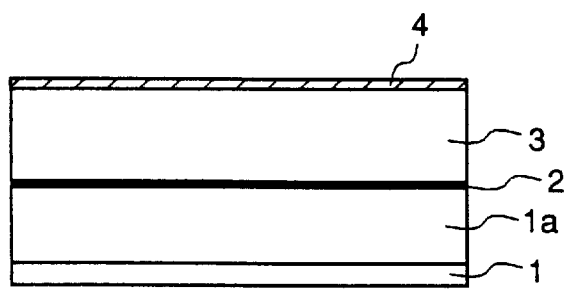
Figure 40:
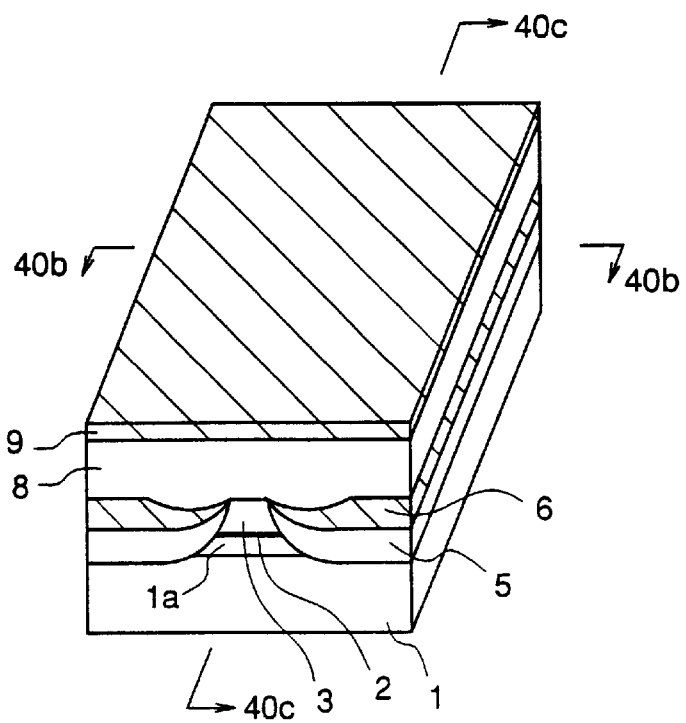
FIG. 40(a) is a perspective view illustrating a third step of the process for fabricating the second semiconductor laser device according to the prior art.
FIGS. 40(b) and 40(c) are cross-sectional views taken along lines 40b—40b and 40c—40c of FIG. 40(a), respectively.
Figure 40:
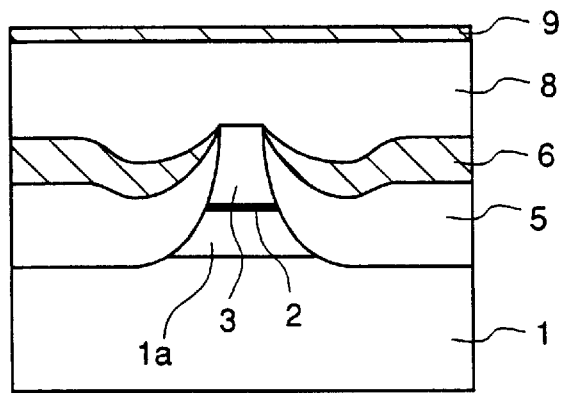
Figure 40:
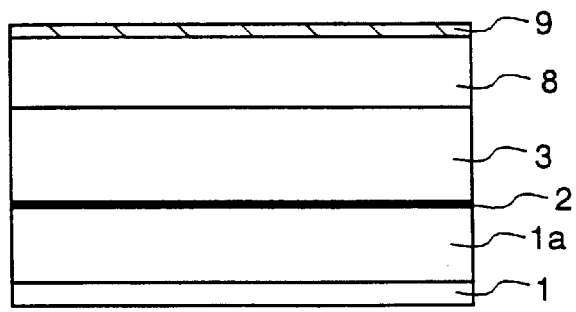

As shown in FIGS. 1(a)–1(c), the device L is fundamentally identical to the prior art device shown in FIGS. 33(a)–33(c), i.e., the device L comprises a semiconductor laser (region I) having a diffraction grating on a region of a semiconductor substrate 1 beneath an active layer 2, a modulator (region III), and an isolation part (region II).

More specifically, the device L has a mesa structure (optical waveguide) M comprising the active layer 2, an n type InP cladding layer 1a, and a p type InP cladding layer 3, on the n type InP substrate 1. On both sides of the mesa structure M, Fe-doped InP semi-insulating semiconductor layers 5 and n type InP hole trapping layers 6 are successively disposed. A p type InP cladding layer 8 is disposed on the mesa structure M and on the hole trapping layers 6, and a p type InGaAs contact layer 9 is disposed on the cladding layer 8. Further, an insulating film 10 and an electrode 11 are disposed on the contact layer 9.

The device L according to this first embodiment is characterized by that the hole trapping layer 6 is discontinuous, i.e., absent in the middle of the structure along the longitudinal direction of the mesa structure M, and an etch stopping layer 7 is inserted between the hole trapping layer 6 and the semi-insulating semiconductor layer 5. As a material of the etch stopping layer 7, for example, n type InGaAsP is employed.

The dimensions of the components of the device L are as follows. The thickness of the semi-insulating semiconductor layer 5 is 3 $\mu$m, the thickness of the hole trapping layer 6 is 0.5 $\mu$g m, the thickness of the etch stopping layer 7 is 50~100 nm, and the thickness of the cladding layer 8 is 2~3 $\mu$m. Further, the width $M_w$ of the mesa structure M is about 1 $\mu$m. The height h of the device L is about 100 $\mu$m.

A description is given of the operation of the device L. The device L has a diffraction grating under the active layer 2 of the laser (region I), and this diffraction grating enables the laser to produce stable single-wavelength light.

The active layer 2 of the laser (region I) and the active layer 2 of the modulator (region III) comprise a continuous InGaAs/InGaAsP multiple quantum well layer. Further, a difference in energies between the base level of conduction band and the base level of valence band in the quantum well layer is smaller in the laser than in the modulator.

Therefore, when no bias voltage is applied to the modulator, light emitted from the laser is not absorbed by the active layer 2 of the modulator. However, when a reverse bias voltage is applied to the modulator, the light is absorbed by the active layer 2 due to the QCSE (Quantum Confined Stark Effect). That is, light emitted from the laser being dc-operated is modulated by varying the bias voltage applied to the modulator.

Further, the Fe doped InP semi-insulating semiconductor layer 5 is disposed on both sides of the mesa structure M comprising the active layer 2 and the upper and lower cladding layers 1a and 3, and serves as a current blocking layer. Since Fe serves as a deep acceptor in InP, the Fe doped semi-insulating semiconductor layer 5 blocks electrons diffusing from the n type InP substrate 1, whereby the threshold current of the device L as a laser is reduced and the efficiency of the laser is improved.

Further, in this first embodiment, the hole trapping layer 6 is absent in the middle of the structure along the longitudinal direction of the mesa structure M. More specifically, the hole trapping layer 6 having a high carrier concentration and a low resistance is absent in the isolation part (region II). Therefore, a high frequency signal applied to the modulator (region III) is prevented from leaking through the hole trapping layer 6 into the laser (region I).

A description is given of a method for fabricating the device L.

Figure 2:
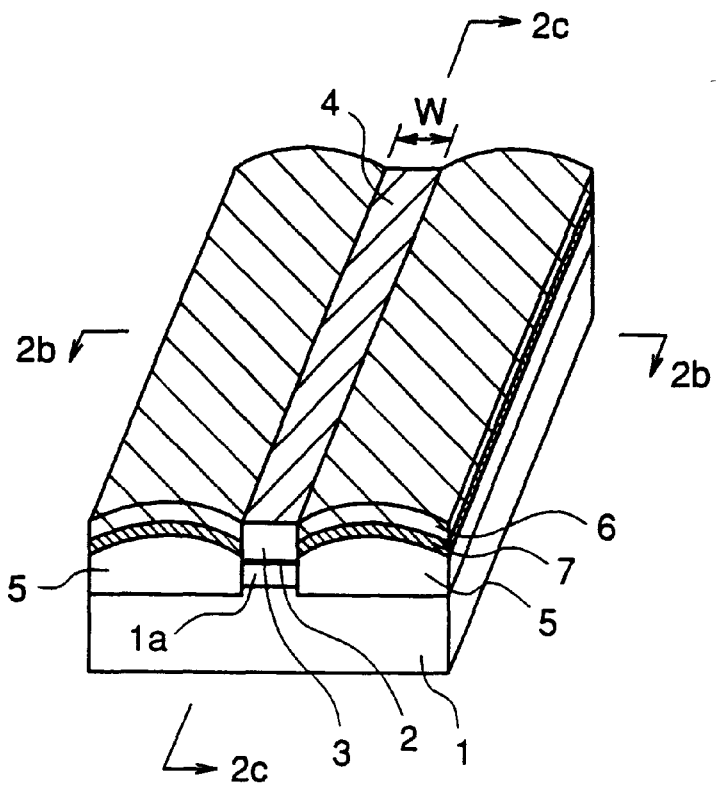
FIG. 2(a) is a perspective view illustrating a first step of a process for fabricating the semiconductor laser device according to the first embodiment.
FIGS. 2(b) and 2(c) are cross-sectional views taken along lines 2b—2b and 2c—2c of FIG. 2(a), respectively.
Figure 2:
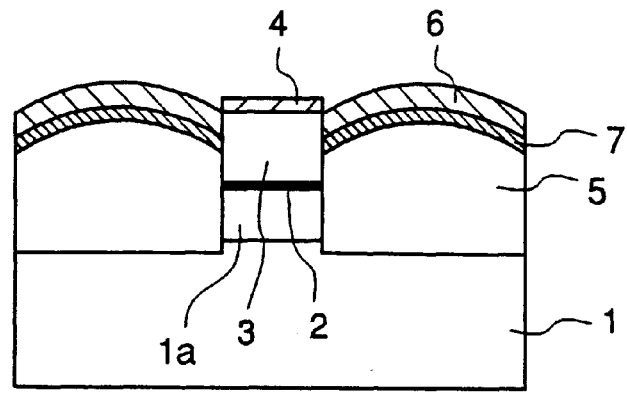
Figure 2:
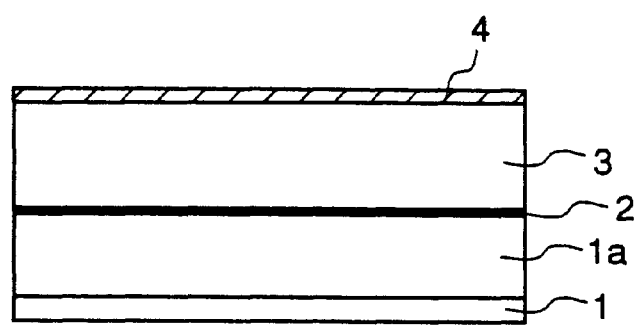
Figure 3:
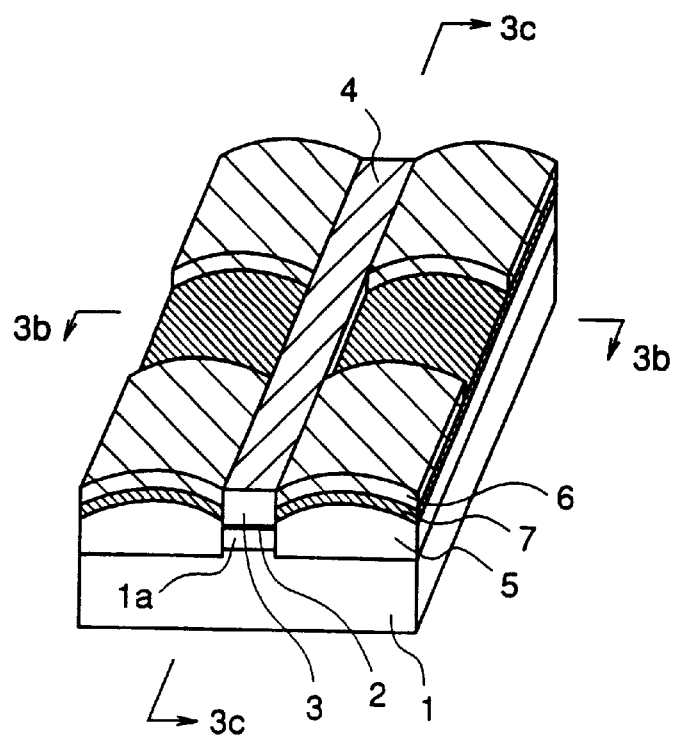
FIG. 3(a) is a perspective view illustrating a second step of the process for fabricating the semiconductor laser device according to the first embodiment.
FIGS. 3(b) and 3(c) are cross-sectional views taken along lines 3b—3b and 3c—3c of FIG. 3(a), respectively.
Figure 3:
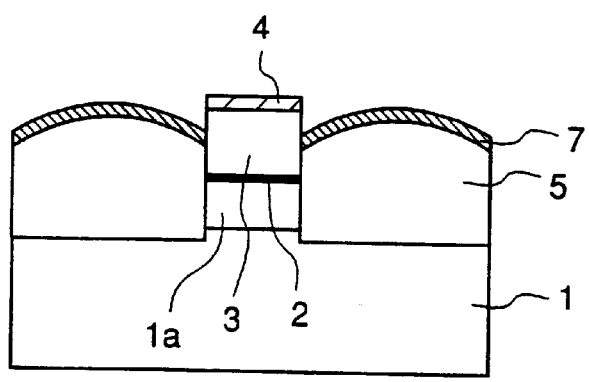
Figure 3:
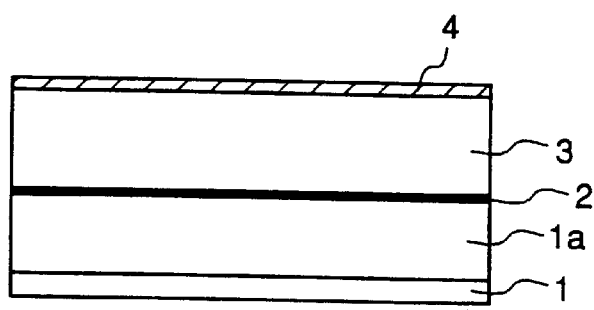
Figure 4:
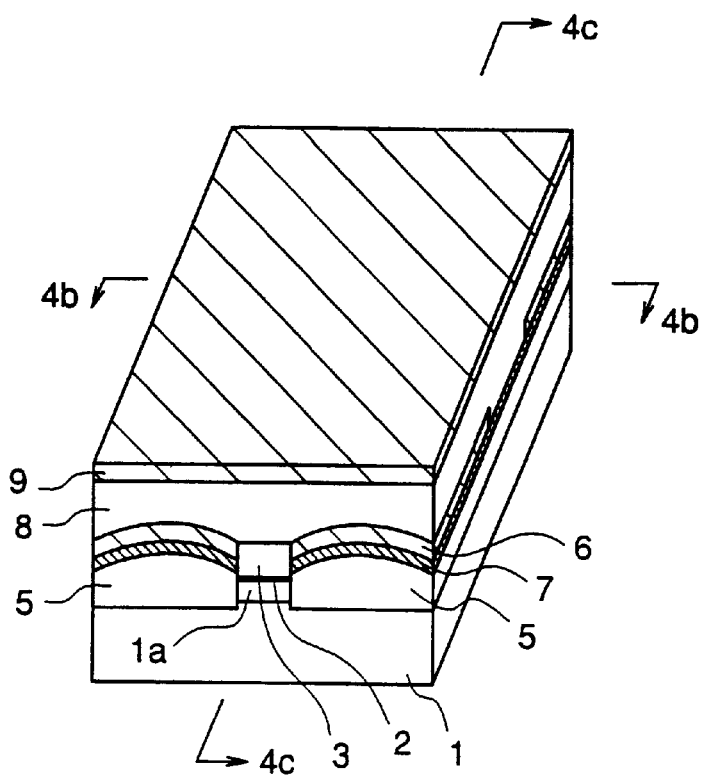
FIG. 4(a) is a perspective view illustrating a third step of the process for fabricating the semiconductor laser device according to the first embodiment.
FIGS. 4(b) and 4(c) are cross-sectional views taken along lines 4b—4b and 4c—4c of FIG. 4(a), respectively.
Figure 4:
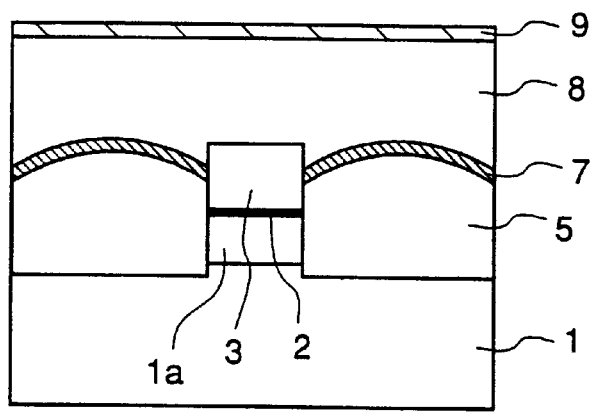
Figure 4:
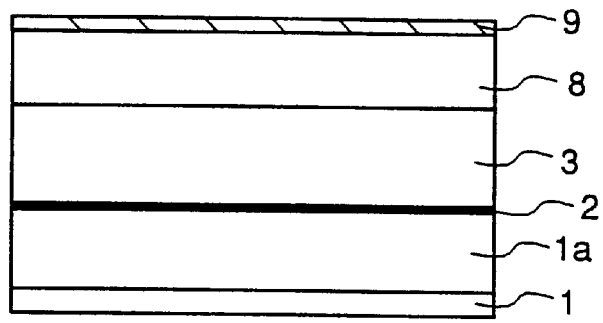

FIGS. 2(a)–2(c), 3(a)–3(c), and 4(a)–4(c) are diagrams illustrating first, second, and third process steps in a method for fabricating the device L, respectively. In these FIGS. 2(a), 3(a), and 4(a) are perspective views, 2(b), 3(b), and 4(b) are cross-sectional views taken along lines 2b—2b, 3b—3b, and 4b—4b of the perspective views, respectively, and 2(c), 3(c), and 4(c) are cross-sectional views taken along lines 2c—2c, 3c—3c, and 4c—4c of the perspective views, respectively.

In the first step shown in FIGS. 2(a)–2(c), initially, a diffraction grating (not shown) is formed on a region of the n type InP semiconductor substrate 1 where a semiconductor laser is fabricated later (region I). Thereafter, an n type InP cladding layer 1a, an active layer 2, and a p type InP cladding layer 3 are successively grown by crystal growth, preferably MOCVD. The active layer 2 is an InGaAs/InGaAsP multiple quantum well (MQW) layer or a single InGaAs layer. Then, a stripe-shaped insulating film 4 having a width W of 1~2 μm is formed on the active layer 2. Using the insulating film 4 as a mask, dry etching is carried out to form a mesa structure M having a height of 2~3 μm, whereby an optical waveguide is fabricated.

Thereafter, using the insulating film 4 as a mask for selective growth, an Fe-doped InP semi-insulating semiconductor layer 5, an n type InGaAsP etch stopping layer 7, and an n type InP hole trapping layer 6 are grown on both sides of the mesa structure M, preferably by MOCVD.

Next, in the second step shown in FIGS. 3(a)–3(c), a portion of the hole trapping layer 6, corresponding to the isolation part (region II) for separating the modulator (region III) and the laser (region I), is removed by wet etching. To be specific, photolithography is performed with the insulating film 4, and a portion of the hole trapping layer 6 corresponding to the isolation part is removed using an etchant that selectively etches InP.

In this first embodiment, n type InGaAsP is employed as a material of the etch stopping layer 7, and the composition of the n type InGaAsP etch stopping layer 7 is selected so that it lattice matches with InP and has a band gap wavelength $\lambda_g$ of 0.92~1.67 μm (preferably, $\lambda_g$=1.18~1.67 μm). To employ n type InGaAsP having a band gap wavelength $\lambda_g$ of 1.18~1.67 μm for the etch stopping layer 7 secures a sufficiently large difference in etching rates between the InP and the InGaAsP, resulting in a satisfactory etching process. Any material can be employed for the etch stopping layer 7 as long as it has a selectivity with respect to InP in a chemical etching process. In addition, the length of the portion to be etched in the 3c—3c direction of FIG. 3(a) is 10~50 μm.

In the third step shown in FIGS. 4(a)–4(c), after removal of the insulating film 4, a p type InP cladding layer 8 and a p type InGaAs contact layer 9 are grown by crystal growth. Next, a portion of the contact layer 9 corresponding to the isolation part (region II) is removed. The range of this removal is 10~50 μm along the longitudinal direction of the mesa structure M (4c—4c direction in FIG. 4(a)). Then, as shown in FIGS. 1(a)–1(c), an insulating film 10 is deposited, and portions of the insulating film 10, opposite regions where electrodes are to be fabricated, are removed. Finally, electrodes 11 are fabricated in contact with the contact layer 9, completing the device L.

As described above, in the device L according to this first embodiment, since the low resistance hole trapping layer 6 is discontinuous, i.e., absent, in the isolation part (region II), it is possible to prevent a high frequency signal applied to the modulator (region III) from leaking through the hole trapping layer 6 into the laser (region I). Therefore, isolation between the laser and the modulator is increased, resulting in a device L with high efficiency and stable performance.

Figure 5:
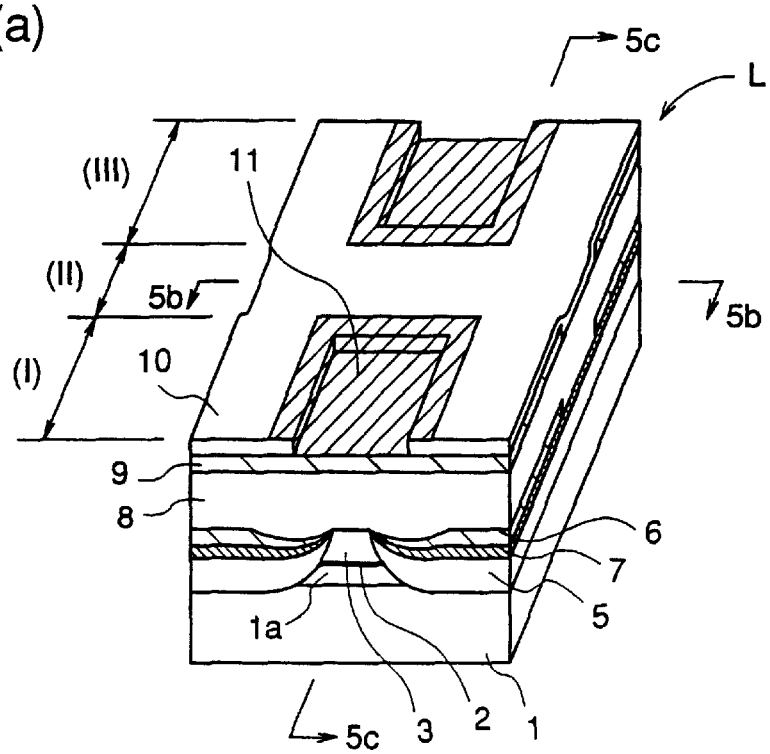
FIG. 5(a) is a perspective view illustrating a semiconductor laser device according to a modification of the first embodiment.
FIGS. 5(b) and 5(c) are cross-sectional views taken along lines 5b—5b and 5c—5c of FIG. 5(a), respectively.
Figure 5:
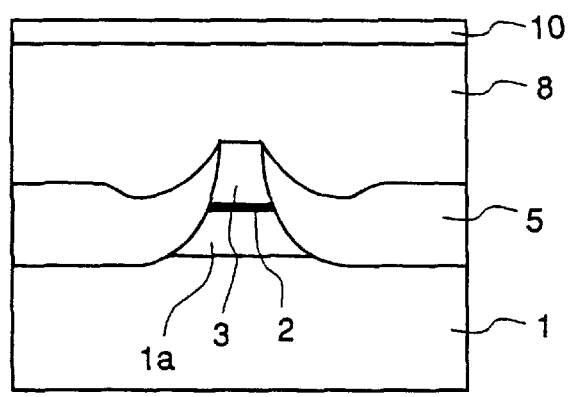
Figure 5:
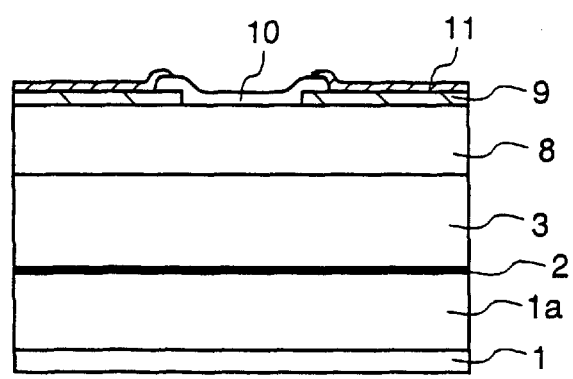
Figure 6:
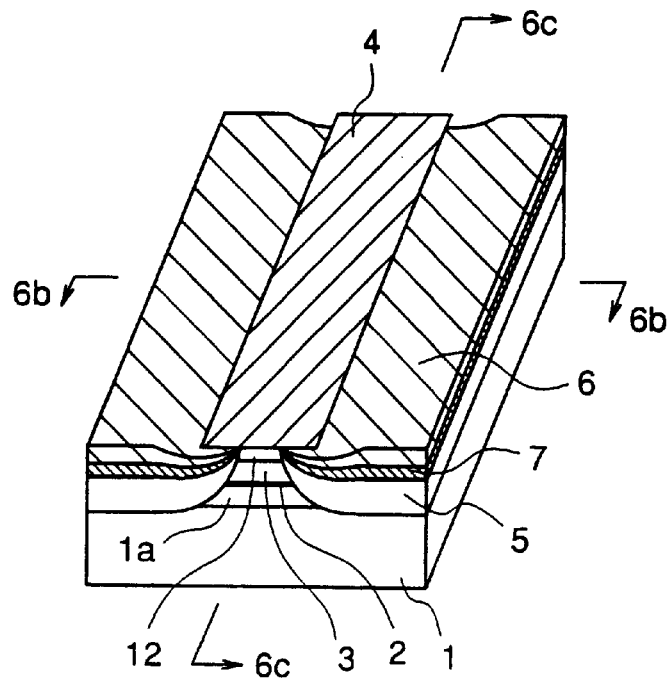
FIG. 6(a) is a perspective view illustrating a first step of a process for fabricating the semiconductor laser device according to the modification.
FIGS. 6(b) and 6(c) are cross-sectional views taken along lines 6b—6b and 6c—6c of FIG. 6(a), respectively.
Figure 6:
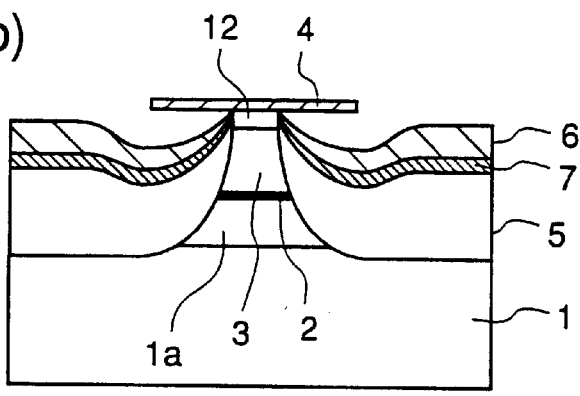
Figure 6:
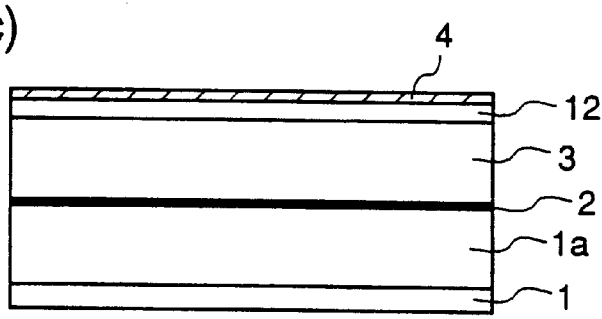
Figure 7:
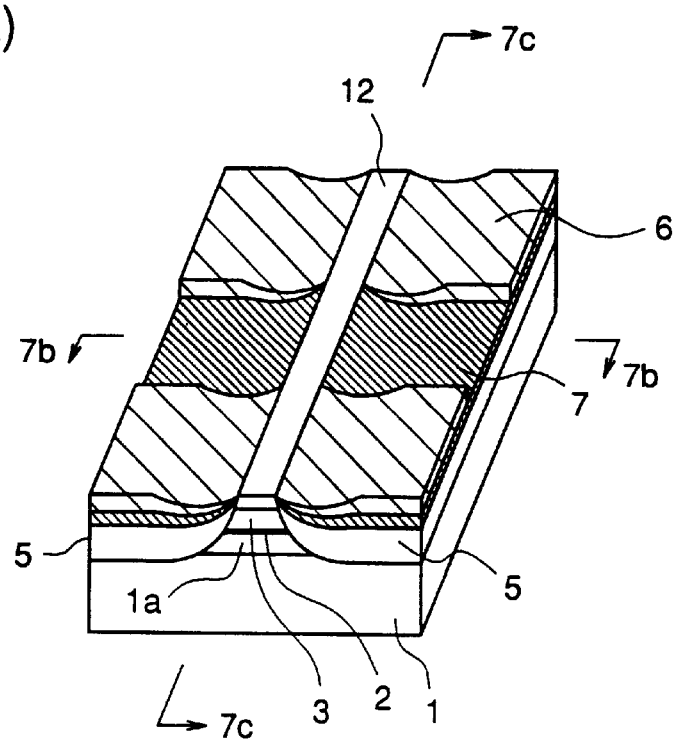
FIG. 7(a) is a perspective view illustrating a second step of the process for fabricating the semiconductor laser device according to the modification.
FIGS. 7(b) and 7(c) are cross-sectional views taken along lines 7b—7b and 7c—7c of FIG. 7(a), respectively.
Figure 7:
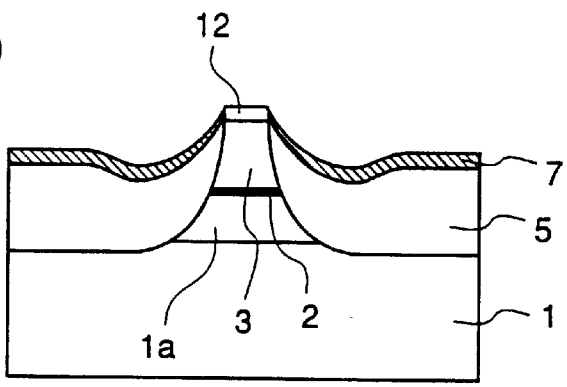
Figure 7:
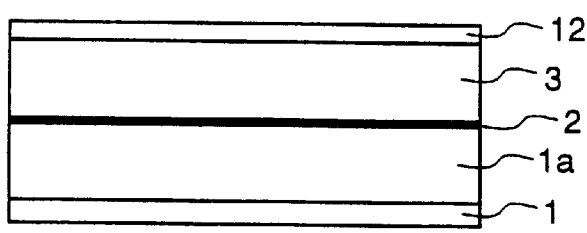
Figure 8:
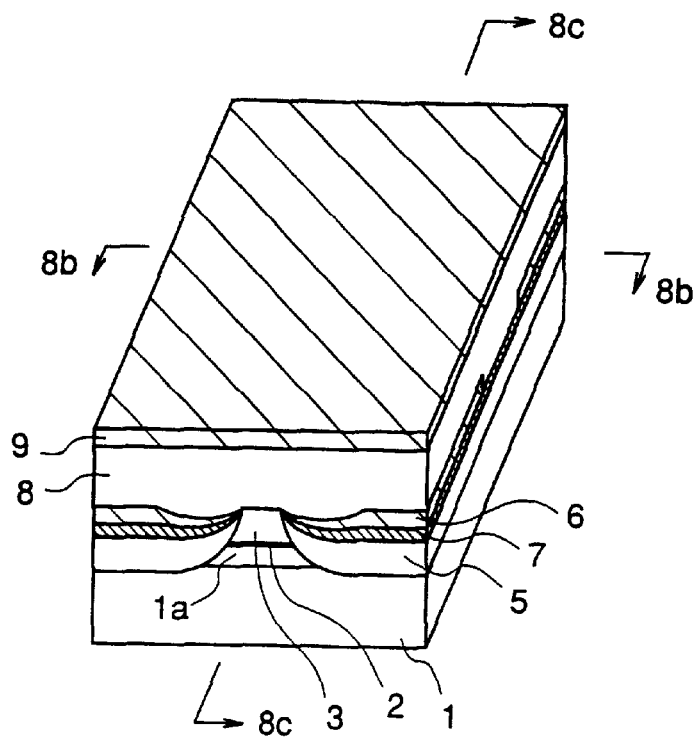
FIG. 8(a) is a perspective view illustrating a third step of the process for fabricating the semiconductor laser device according to the modification.
FIGS. 8(b) and 8(c) are cross-sectional views taken along lines 8b—8b and 8c—8c of FIG. 8(a), respectively.
Figure 8:
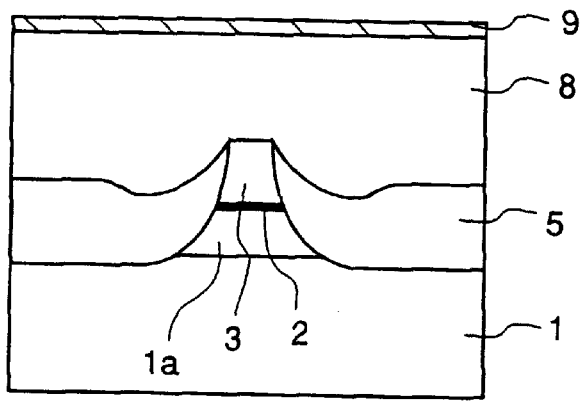
Figure 8:
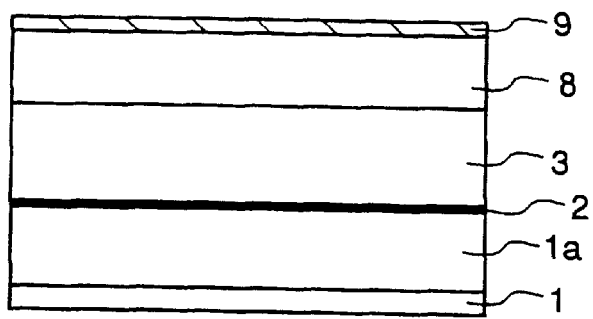

FIG. 5(a) is a perspective view illustrating a device L in which a mesa structure M is fabricated by wet etching, according to a modification of the first embodiment, and FIGS. 5(b) and 5(c) are cross-sectional views taken along lines 5b—5b and 5c—5c of FIG. 5(a), respectively. Furthermore, FIGS. 6(a)–6(c), 7(a)–7(c), and 8(a)–8(c) are diagrams illustrating first, second, and third process steps in a method for fabricating the device L according to the modification, respectively. In these FIGS. 6(a), 7(a), and 8(a) are perspective views, 6(b), 7(b), and 8(b) are cross-sectional views taken along lines 6b—6b, 7b—7b, and 8b—8b of the perspective views, respectively, and 6(c), 7(c), and 8(c) are cross-sectional views taken along lines 6c—6c, 7c—7c, and 8c—8c of the perspective views, respectively.

The fabrication method of the device L using wet etching in formation of the mesa structure M is different from the fabrication method using dry etching mentioned above in the following respects.

① As shown in FIG. 6(a), in advance of the etching process, a cap layer 12, for example, a p type InGaAsP layer, is formed.

② Since wet etching is isotropic, the width of the insulating film 4 is larger than that for the dry etching.

③ As shown in FIG. 6(b), when the hole trapping layer 6 is selectively etched, photolithography is carried out after removing the insulating film 4.

Other process steps are identical to those already described with respect to FIGS. 1(a)–1(c) to 4(a)–4(c) wherein the mesa structure M is formed by dry etching. Even in the case of employing wet etching for formation of the mesa structure M, the same function and effect as those obtained in the case of employing dry etching are achieved. In this modification of the first embodiment, the same elements in FIGS. 5(a)–5(c) to 8(a)–8(c) that appear in FIGS. 1(a)–1(c) to 4(a)–4(c) are given the same reference numerals, so descriptions thereof are omitted.

[Embodiment 2]

Figure 9:
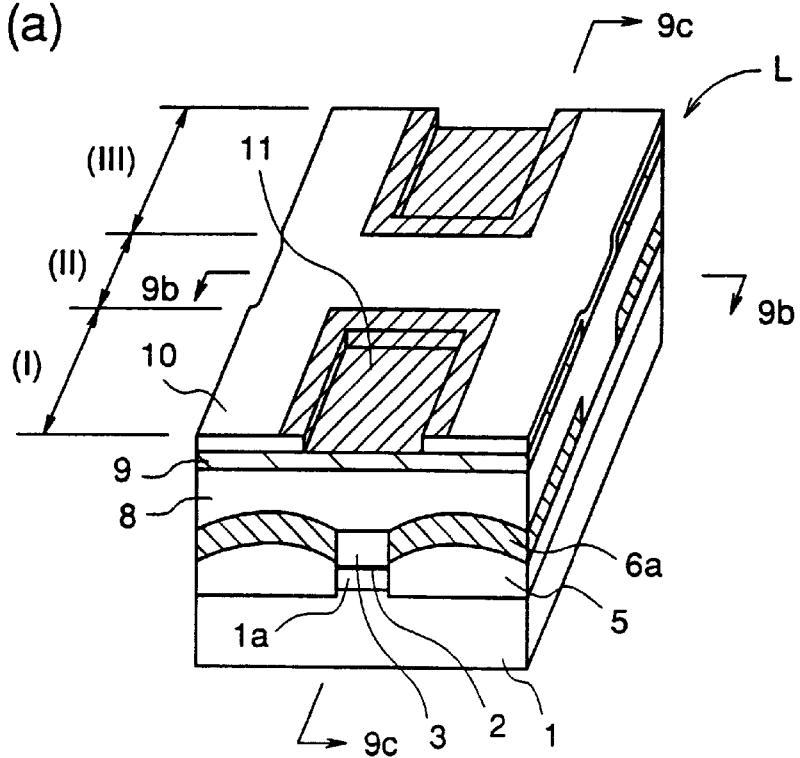
FIG. 9(a) is a perspective view illustrating a semiconductor laser device according to a second embodiment of the invention.
FIGS. 9(b) and 9(c) are cross-sectional views taken along lines 9b—9b and 9c—9c of FIG. 9(a), respectively.
Figure 9:
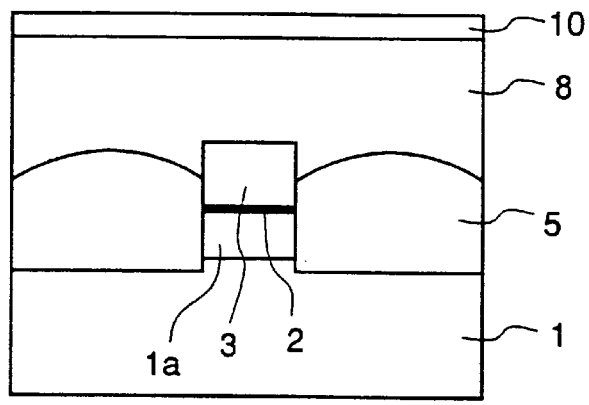
Figure 9:
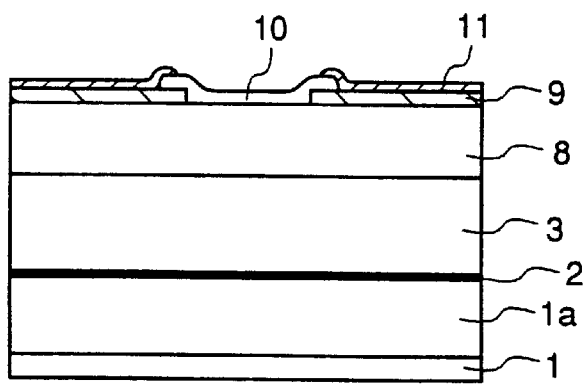

FIG. 9(a) is a perspective view illustrating a device L according to a second embodiment of the invention, and FIGS. 9(b) and 9(c) are cross-sectional views taken along lines 9b—9b and 9c—9c of FIG. 9(a), respectively.

As shown in FIGS. 9(a)–9(c), the device L according to this second embodiment is fundamentally identical to the prior art device L shown in FIGS. 33(a)–33(c), i.e., the device L comprises a semiconductor laser (region I) having a diffraction grating (not shown) on a region of a semiconductor substrate beneath an active layer 2, a modulator (region III), and an isolation part (region II) for separating the laser and the modulator. Reference numeral 6a designates a hole trapping layer.

While in the first embodiment the etch stopping layer 7 is used for the selective etching of the hole trapping layer 6, in this second embodiment, selective etching of the hole trapping layer 6a is realized, not by using an etch stopping layer, but by appropriately selecting materials of the hole trapping layer 6a and the semi-insulating semiconductor layer 5. Other elements are identical to those already described for the first embodiment, and the same elements in FIGS. 9(a)–9(c) that appear in FIGS. 1(a)–1(c) are given the same reference numerals.

To be specific, the device L has a mesa structure M (optical waveguide) comprising the active layer 2, an n type InP cladding layer 1a, and a p type InP cladding layer 3, on the n type InP substrate 1. On both sides of the mesa structure M, Fe-doped InP semi-insulating semiconductor layers 5 and InGaAsP hole trapping layers 6a are successively disposed. A p type InP cladding layer 8 is disposed on the mesa structure M, on the semi-insulating semiconductor layers 5, and on the hole trapping layers 6a. A p type InGaAs contact layer 9 is disposed on the p type InP cladding layer 8. Further, an insulating film 10 and electrodes 11 are disposed on the contact layer 9.

In this second embodiment of the invention, InGaAsP is employed as a material of the hole trapping layer 6a, and the composition of the InGaAsP hole trapping layer 8a is selected so that it lattice matches with InP and has a band gap wavelength $\lambda_g$ of 0.92~1.67 $\mu$m (preferably, $\lambda_g$=1.18~1.67 $\lambda$m). To employ InGaAsP having a band gap wavelength $\lambda_g$ of 5.18~1.67 $\mu$m for the hole trapping layer 6a secures a sufficiently large difference in etching rates between the InP and the InGaAsP, resulting in a satisfactory etching process.

The dimensions of the components of the device L are as follows. The thickness of the semi-insulating semiconductor layer 5 is 3 $\mu$m, the thickness of the hole trapping layer 6a is 0.5 $\mu$m, and the thickness of the cladding layer 8 is 2~3 $\mu$m. Further, the width $M_w$ of the mesa structure M is about 1 $\mu$m, and the height h of the device L is about 100 $\mu$m.

The operation of the device L according to this second embodiment is identical to that described for the first embodiment and, therefore, does not require repeated description.

A description is given of a method for fabricating the device L according to this second embodiment.

Figure 10:
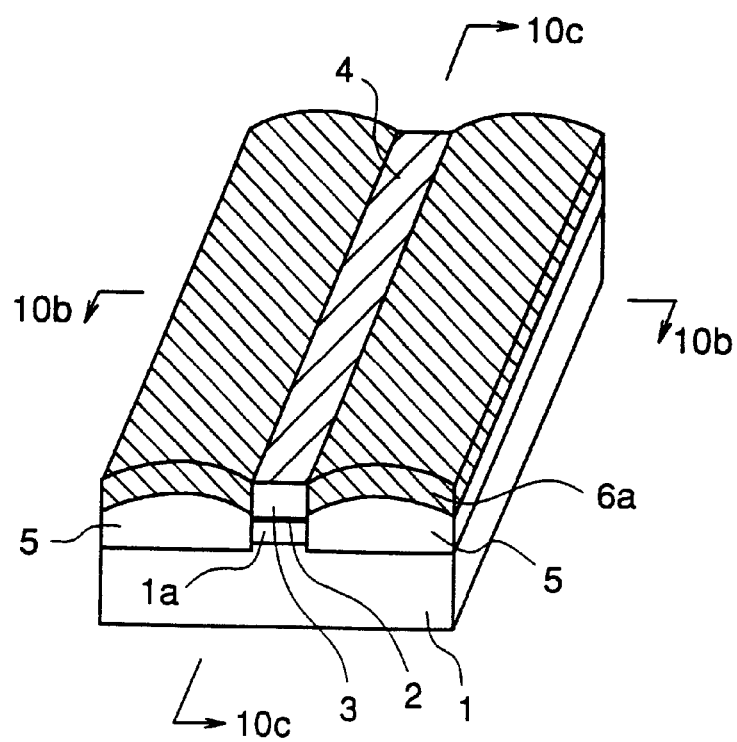
FIG. 10(a) is a perspective view illustrating a first step of a process for fabricating the semiconductor laser device according to the second embodiment.
FIGS. 10(b) and 10(c) are cross-sectional views taken along lines 10b—10b and 10c—10c of FIG. 10(a), respectively.
Figure 10:
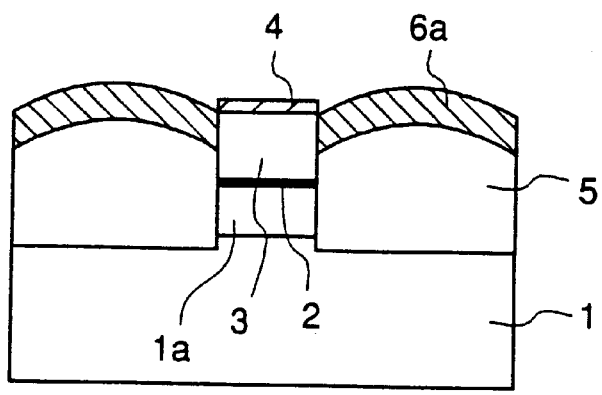
Figure 10:
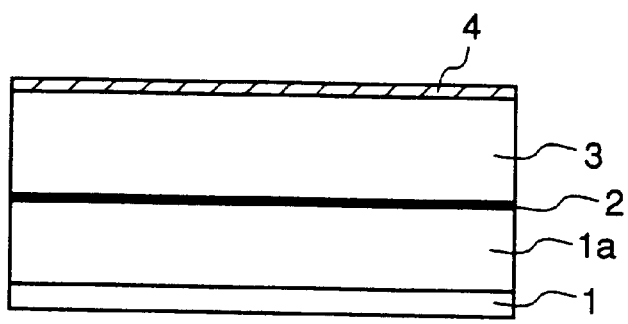
Figure 11:
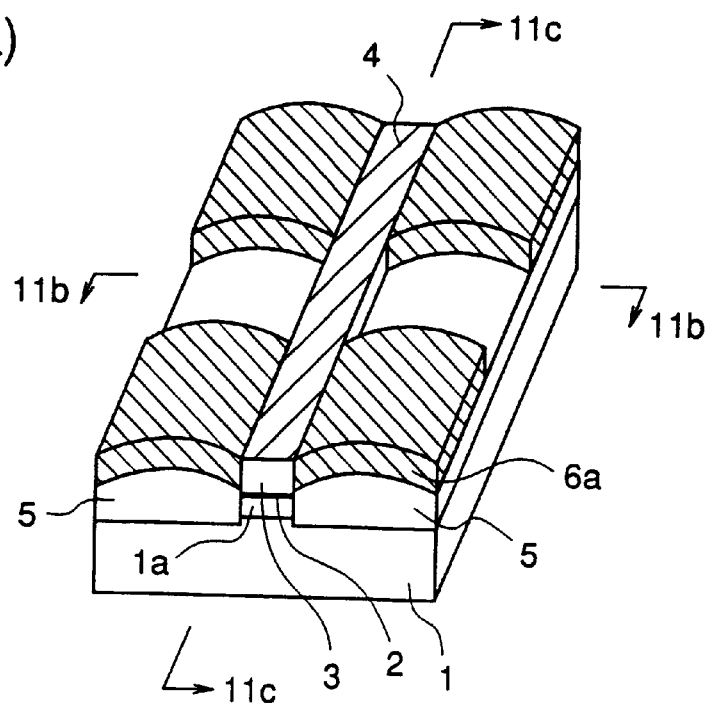
FIG. 11(a) is a perspective view illustrating a second step of the process for fabricating the semiconductor laser device according to the second embodiment.
FIGS. 11(b) and 11(c) are cross-sectional views taken along lines 11b—11b and 11c—11c of FIG. 11(a), respectively.
Figure 11:
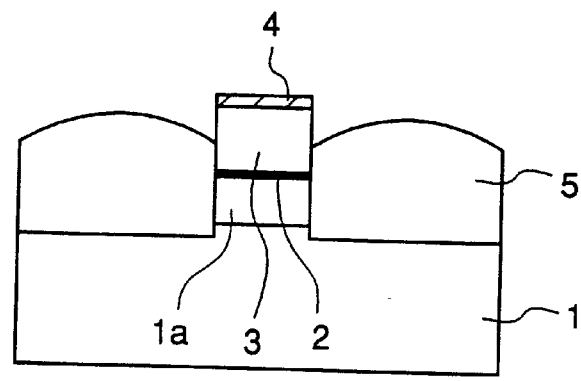
Figure 11:
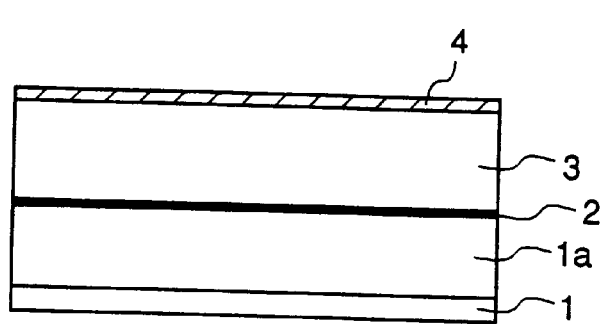
Figure 12:
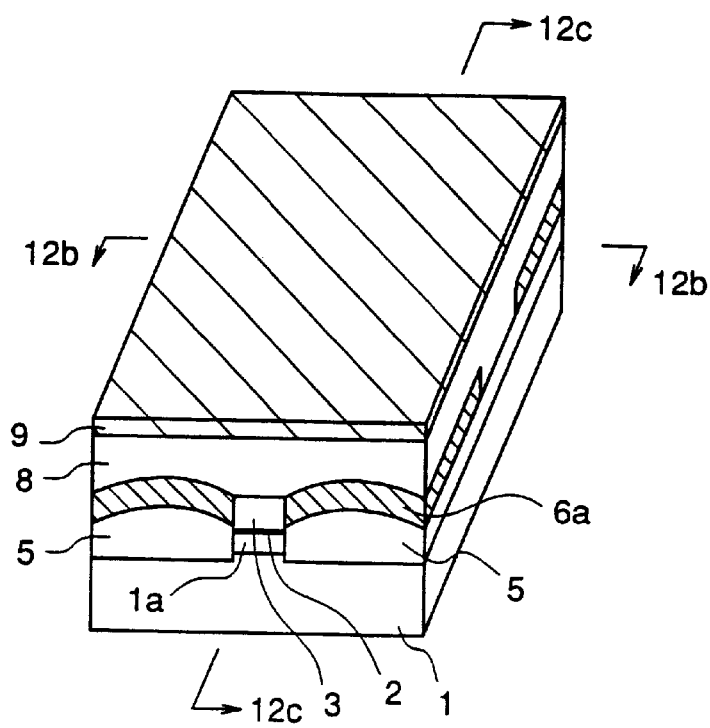
FIG. 12(a) is a perspective view illustrating a third step of the process for fabricating the semiconductor laser device according to the second embodiment.
FIGS. 12(b) and 12(c) are cross-sectional views taken along lines 12b—12b and 12c—12c of FIG. 12(a), respectively.
Figure 12:
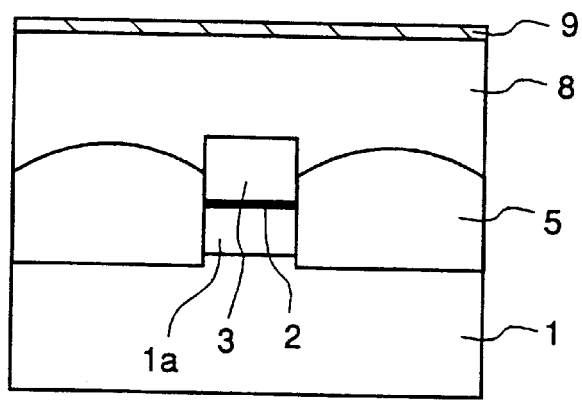
Figure 12:
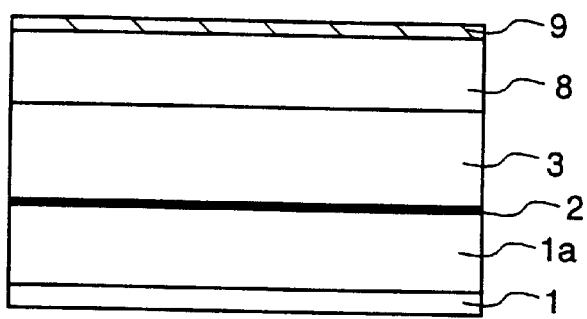

FIGS. 10(a)–10(c), 11(a)–11(c), and 12(a)–12(c) are diagrams illustrating first, second, and third process steps in a method for fabricating the device L, respectively. In these FIGS. 10(a), 11(a), and 12(a) are perspective views, 10(b), 11(b), and 12(b) are cross-sectional views taken along lines 10b—10b, 11b—11b, and 12b—12b of the perspective views, respectively, and 10(c), 11(c), and 12(c) are cross-sectional views taken along lines 10c—10c, 11c—11c, and 12c—12c of the perspective views, respectively.

In the first step shown in FIGS. 10(a)–10(c), initially, a diffraction grating (not shown) is formed on a region of the n type InP semiconductor substrate 1 where a semiconductor laser is later fabricated (region I). Thereafter, an n type InP cladding layer 1a, an active layer 2, and a p type InP cladding layer 3 are successively grown, preferably by MOCVD. Like the first embodiment, the active layer 2 is an InGaAs/InGaAsP multiple quantum well (MQW) layer or a single InGaAs layer. Then, a stripe-shaped insulating film 4 having a width W of 1~2 $\mu$m is formed on the active layer 2. Using the insulating film 4 as a mask, dry etching is carried out to form a mesa structure M having a height of 2~3 $\mu$m, providing an optical waveguide.

Thereafter, using the insulating film 4 as a mask for selective growth, an Fe-doped InP semi-insulating semiconductor layer 5 and an n type InGaAsP hole trapping layer 6a are grown on the substrate 1, contacting both sides of the mesa structure M, preferably by MOCVD.

In place of InGaAsP, n type InAlAs may be employed for the hole trapping layer 6a. In this case, the composition of the InAlAs hole trapping layer 6a is selected so that it lattice matches with InP and has a band gap wavelength $\lambda_g$ of 0.86 $\mu$m. To employ InAlAs having such a composition for the hole trapping layer 6a secures a sufficiently large difference in etching rates between the InP and the InAlAs, resulting in a satisfactory etching process.

In the second step shown in FIGS. 11(a)–11(c), a portion of the hole trapping layer 6a corresponding to the isolation part (region II) that separates the modulator (region III) and the laser (region I) is removed by wet etching. To be specific, photolithography is carried out with the insulating film 4, and a portion of the hole trapping layer 6a corresponding to the isolation part is removed.

In this second embodiment, since Fe-doped InP is employed for the semi-insulating semiconductor layer 5 and n type InGaAsP is employed for the hole trapping layer 6a, only the hole trapping layer 6a can be selectively and accurately etched due to a difference in compositions between InP and InGaAsP, with no necessity of using an etch stopping layer. The length of the portion to be etched is 10~50 $\mu$m as described for the first embodiment.

In the third step shown in FIGS. 12(a)–12(c), after removal of the insulating film 4, a p type InP cladding layer 8 and a p type InGaAs contact layer 9 are grown by crystal growth. Next, a portion of the contact layer 9 corresponding to the isolation part (region II) is removed. The range of this removal is 10~50 $\mu$m along the longitudinal direction of the mesa structure M (12c—12c direction in FIG. 12(a)). Then, as shown in FIGS. 9(a)–9(c), an insulating film 10 is formed on the contact layer 9, and portions of the insulating film 10, opposite regions where electrodes are to be fabricated, are removed. Finally, electrodes 11 are fabricated in contact with the contact layer 9, completing the device L.

As described above, in the device L according to the second embodiment of the invention, since the low-resistance hole trapping layer 6a is discontinuous, i.e., absent in the isolation part (region II), it is possible to prevent a high-frequency signal applied to the modulator (region III) from leaking through the hole trapping layer 6a into the laser (region I). Therefore, isolation between the laser and the modulator is increased, resulting in a device L with improved efficiency and stable performance. In addition, since the etch stopping layer 7, which is used for the selective etching of the hole trapping layer 6 in the first embodiment, can be dispensed with, the fabrication process is simplified. Further, since the hole trapping layer 6a is disposed directly on the semi-insulating semiconductor layer 5 parasitic resistance of the device is reduced and light emitting efficiency of the semiconductor laser is improved.

Figure 13:
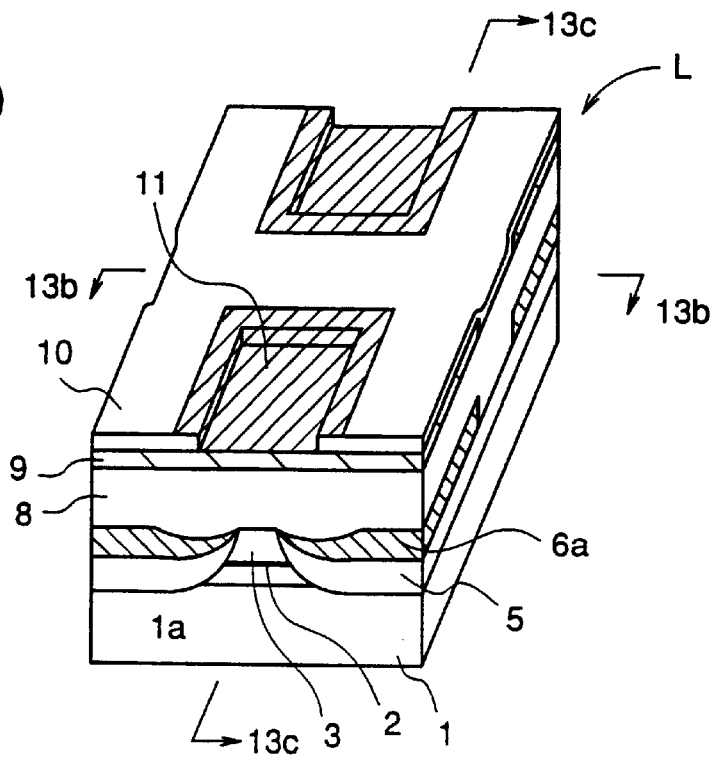
FIG. 13(a) is a perspective view illustrating a semiconductor laser device according to a modification of the second embodiment.
FIGS. 13(b) and 13(c) are cross-sectional views taken along lines 13b—13b and 13c—13c of FIG. 13(a), respectively.
Figure 13:
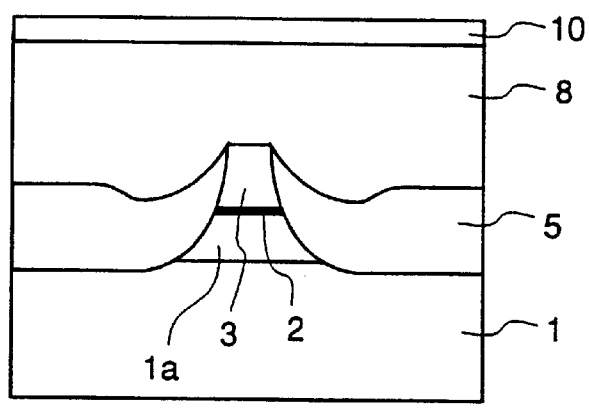
Figure 13:
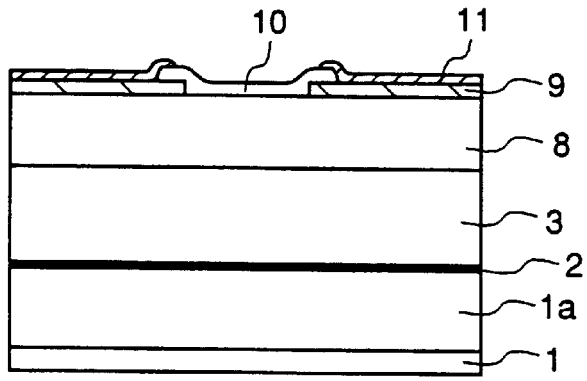
Figure 14:
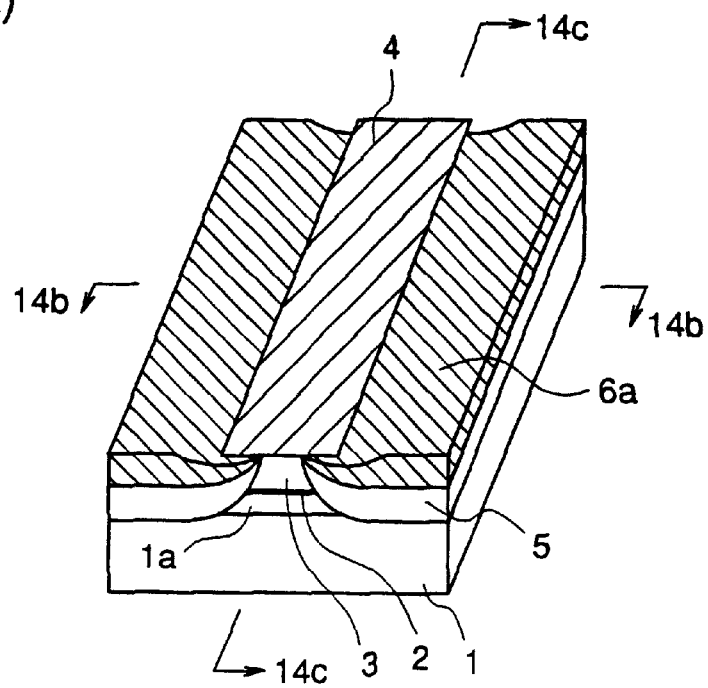
FIG. 14(a) is a perspective view illustrating a first step of a process for fabricating the semiconductor laser device according to the modification.
FIGS. 14(b) and 14(c) are cross-sectional views taken along lines 14b—14b and 14c—14c of FIG. 14(a), respectively.
Figure 14:
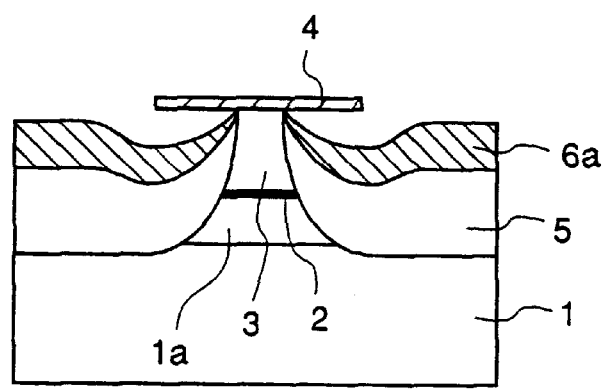
Figure 14:
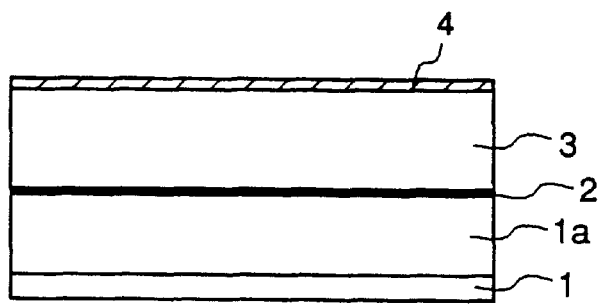
Figure 15:
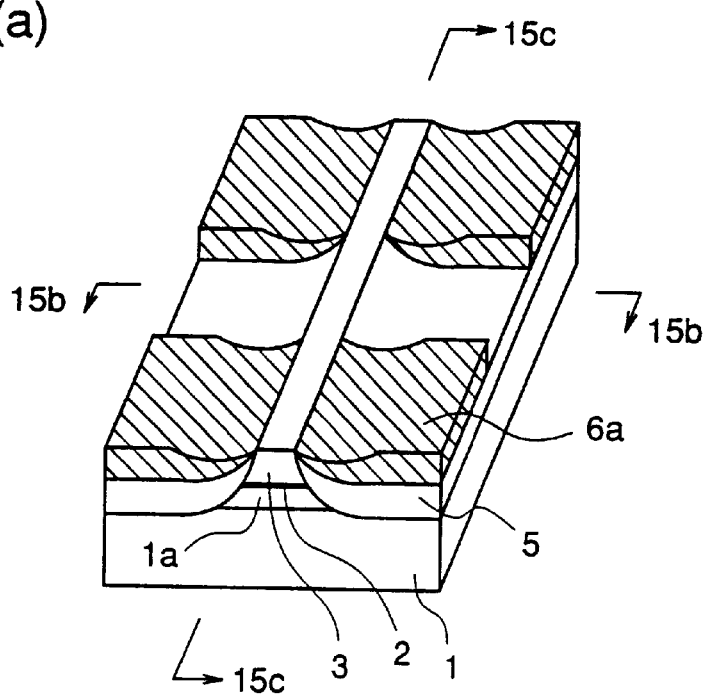
FIG. 15(a) is a perspective view illustrating a second step of the process for fabricating the semiconductor laser device according to the modification.
FIGS. 15(b) and 15(c) are cross-sectional views taken along lines 15b—15b and 15c—15c of FIG. 15(a), respectively.
Figure 15:
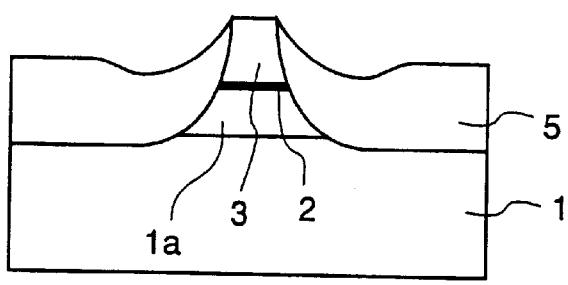
Figure 15:
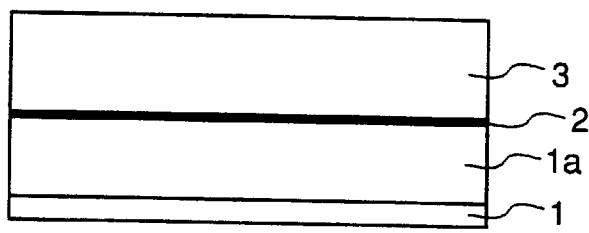
Figure 16:
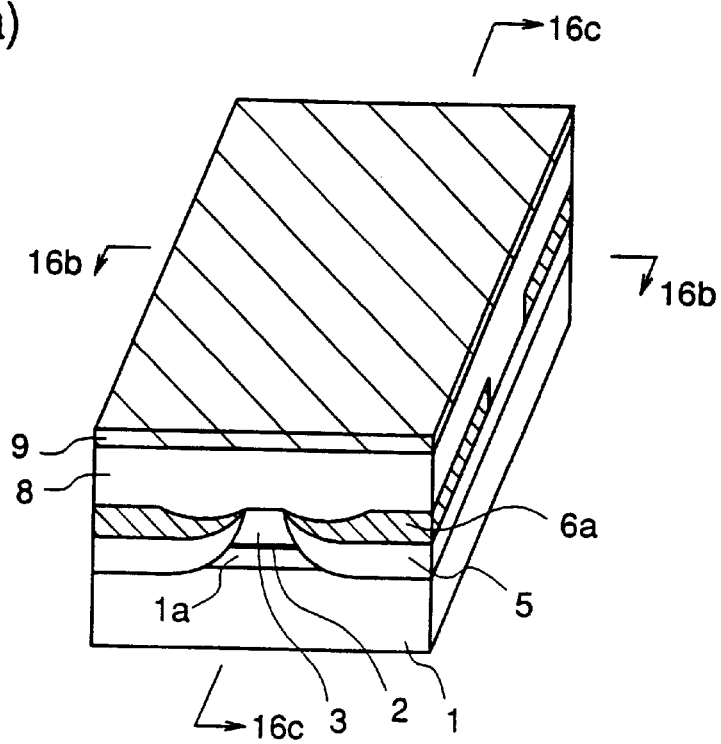
FIG. 16(a) is a perspective view illustrating a third step of the process for fabricating the semiconductor laser device according to the modification.
FIGS. 16(b) and 16(c) are cross-sectional views taken along lines 16b—16b and 16c—16c of FIG. 16(a), respectively.
Figure 16:
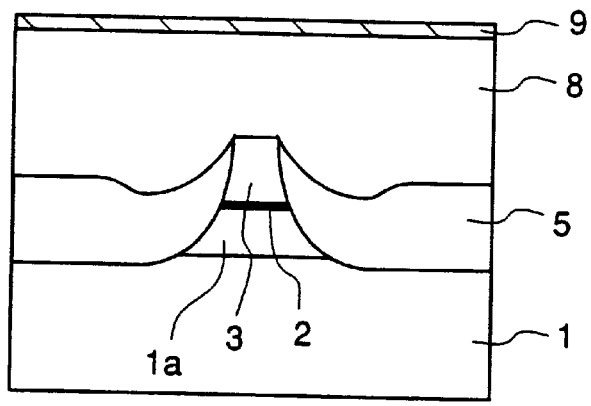
Figure 16:
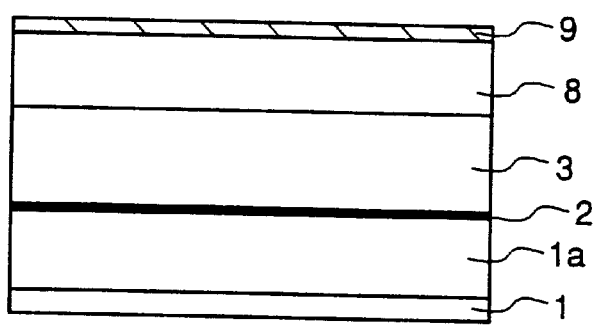

FIG. 13(a) is a perspective view illustrating a device L in which a mesa structure M is fabricated by wet etching, according to a modification of the second embodiment, and FIGS. 13(b) and 13(c) are cross-sectional views taken along lines 13b—13b and 13c—13c of FIG. 13(a), respectively. Furthermore, FIGS. 14(a)–14(c), 15(a)–15(c), and 16(a)–16(c) are diagrams illustrating first, second, and third process steps in a method for fabricating the device L according to the modification, respectively. In these FIGS. 14(a), 15(a), and 16(a) are perspective views, 14(b), 15(b), and 16(b) are cross-sectional views taken along lines 14b—14b, 15b—15b, and 16b—16b of the perspective views, respectively, and 14(c), 15(c), and 16(c) are cross-sectional views taken along lines 14c—14c, 15c—15c, and 16c—16c of the perspective views, respectively.

The fabrication method of the device L using wet etching in formation of the mesa structure M is different from the fabrication method using dry etching mentioned above in the following respects.

① Since wet etching is isotropic, the width of the insulating film 4 is larger than that in dry etching.

② As shown in FIG. 15(b), when a portion of the hole trapping layer 6 is selectively etched, photolithography is carried out after removing the insulating film 4.

Further, the cap layer used for the modification of the first embodiment is not employed.

Other process steps are identical to those already described with respect to FIGS. 9(a)–9(c) to 12(a)–12(c) wherein the mesa structure M is formed by dry etching. Even when the mesa structure M is formed by wet etching as mentioned above, the same function and effect as those obtained in the case of employing dry etching are achieved. In this modification of the second embodiment, the same elements in FIGS. 13(a)–13(c) to 16(a)–16(c) that appear in FIGS. 9(a)–9(c) to 12(a)–12(c) are given the same reference numerals, so descriptions thereof are omitted.

[Embodiment 3]

Figure 17:
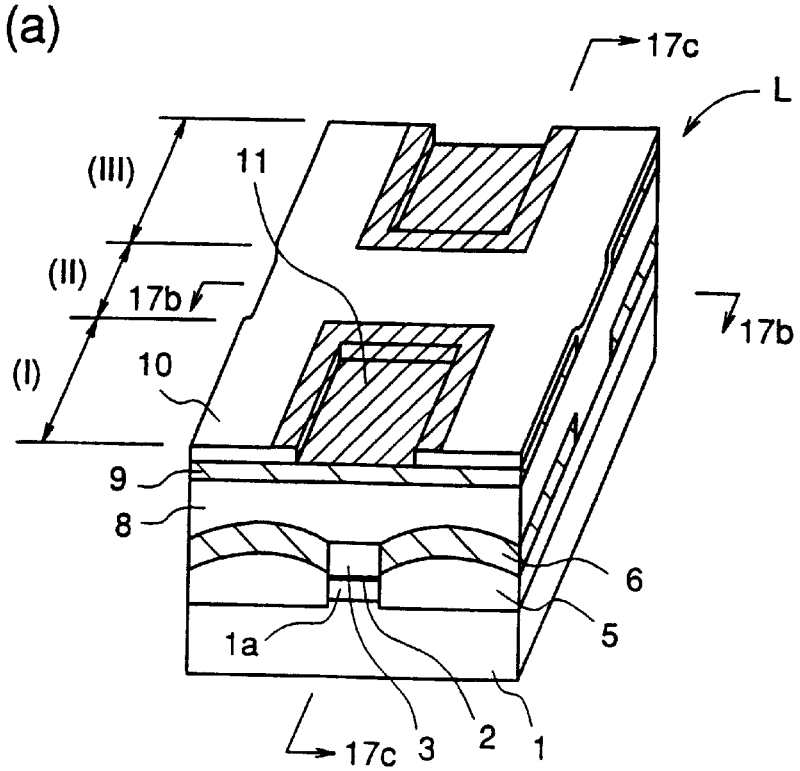
FIG. 17(a) is a perspective view illustrating a semiconductor laser device according to a third embodiment of the invention.
FIGS. 17(b) and 17(c) are cross-sectional views taken along lines 17b—17b and 17c—17c of FIG. 17(a), respectively.
Figure 17:
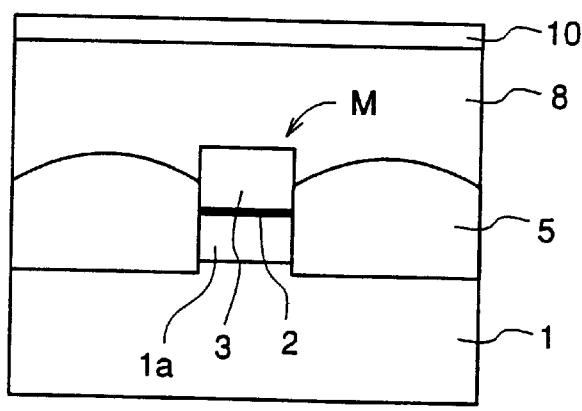
Figure 17:
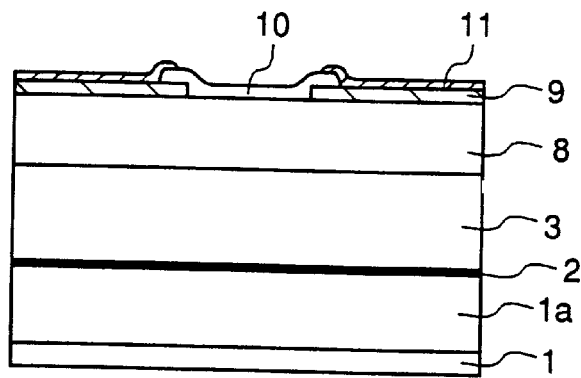

FIG. 17 (a) is a perspective view illustrating a device L according to a third embodiment of the present invention. FIGS. 17(b) and 17(c) are cross-sectional views taken along lines 17b—17b and 17c—17c of FIG. 17(a), respectively.

With reference to these figures, the structure of the device L according to this third embodiment is fundamentally identical to the structure according to the first embodiment, that is, the device L comprises a semiconductor laser (region I) having a diffraction grating (not shown) on a region of a semiconductor substrate 1 beneath an active layer 2, a modulator (region III), and an isolation part (region II) for separating the laser from the modulator.

To be specific, the device L has a mesa structure M (optical waveguide) comprising the active layer 2, an n type InP cladding layer 1a, and a p type InP cladding layer 3, on the n type InP substrate 1. On both sides of the mesa structure M, Fe-doped InP semi-insulating semiconductor layers 5 and n type InGaAsP hole trapping layers 6 are successively disposed. A p type InP cladding layer 8 is disposed on the mesa structure M, on the semi-insulating semiconductor layers 5, and on the hole trapping layers 6. A p type InGaAs contact layer 9 is disposed on the cladding layer 8. An insulating film 10 and electrodes 11 are disposed on the contact layer 9.

The characteristics of this third embodiment are as follows:

① The hole trapping layer 6 is discontinuous, i.e., absent, in the middle of the structure along the longitudinal direction of the mesa structure M.

② As described later for the fabrication process of the device L, to make the discontinuous hole trapping layer 6, a portion of the hole trapping layer 6 is removed using dry etching.

③ While in the first embodiment the etch stopping layer 7 is used for the selective etching of the hole trapping layer 6, in this third embodiment, selective etching of the hole trapping layer 6 is realized, not by using such an etch stopping layer, but by appropriately selecting materials of the hole trapping layer 6 and the semi-insulating semiconductor layer 5.

The dimensions of the components of the device L are as follows. The thickness of the semi-insulating semiconductor layer 5 is 3 μm, the thickness of the hole trapping layer 6 is 0.5 μm, and the thickness of the cladding layer 8 is 2~3 μm. Further, the width $M_w$ of the mesa structure M is about 1 μm. The height h of the device L is about 100 μm.

The operation of the device L according to this third embodiment is identical to that already described for the first and second embodiments and, therefore, does not require repeated description.

A description is given of a method for fabricating the device L according to this third embodiment.

Figure 18:
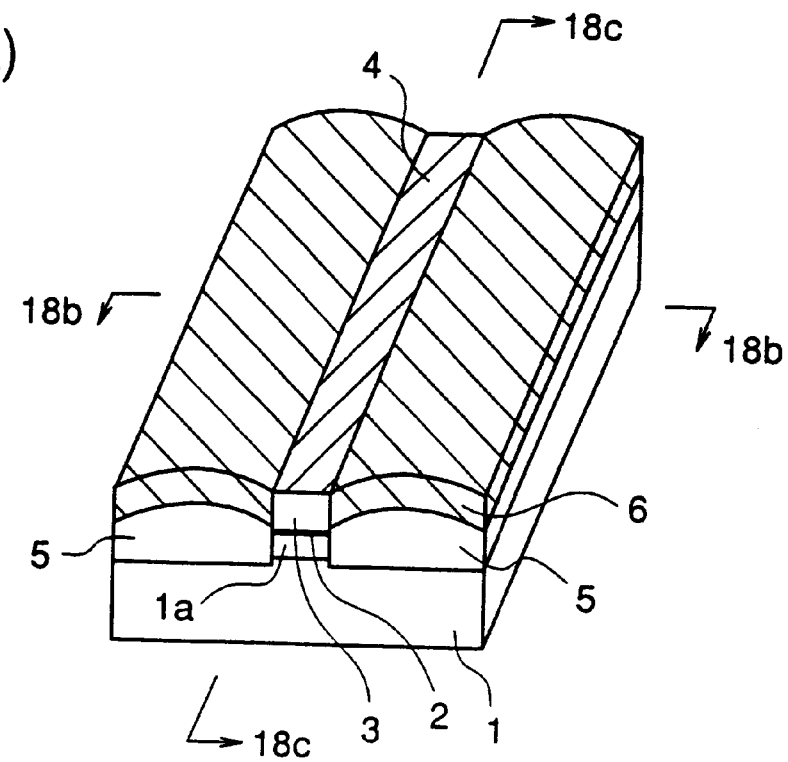
FIG. 18(a) is a perspective view illustrating a first step of a process for fabricating the semiconductor laser device according to the third embodiment.
FIGS. 18(b) and 18(c) are cross-sectional views taken along lines 18b—18b and 18c—18c of FIG. 18(a), respectively.
Figure 18:
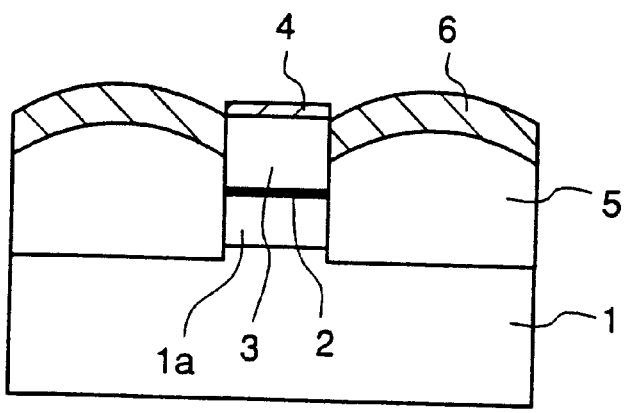
Figure 18:
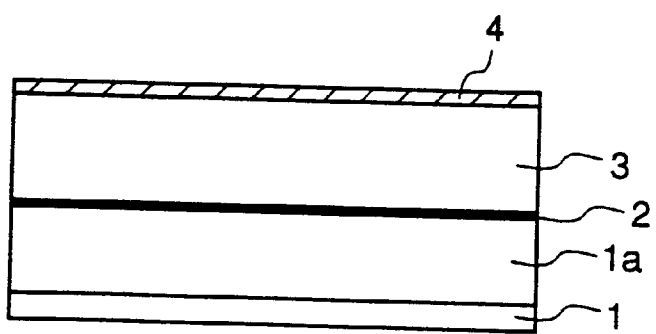
Figure 19:
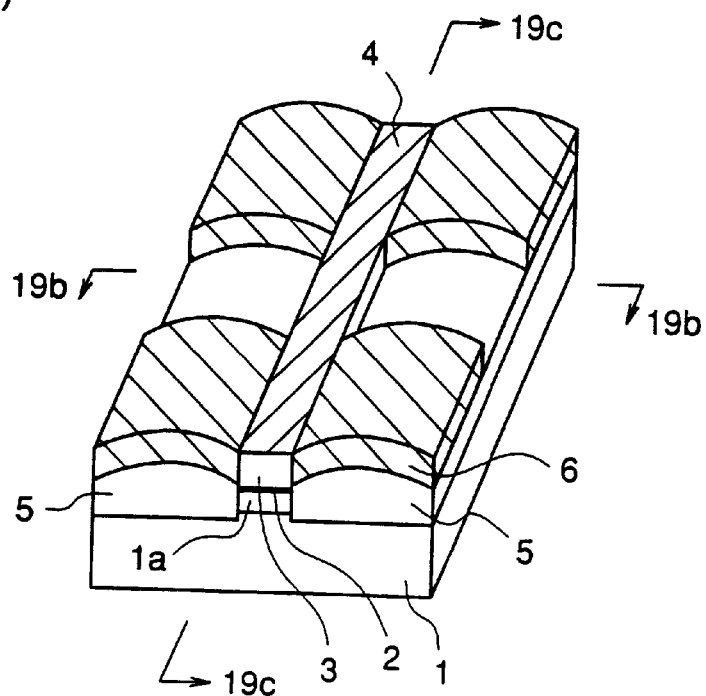
FIG. 19(a) is a perspective view illustrating a second step of the process for fabricating the semiconductor laser device according to the third embodiment.
FIGS. 19(b) and 19(c) are cross-sectional views taken along lines 19b—19b and 19c—19c of FIG. 19(a), respectively.
Figure 19:
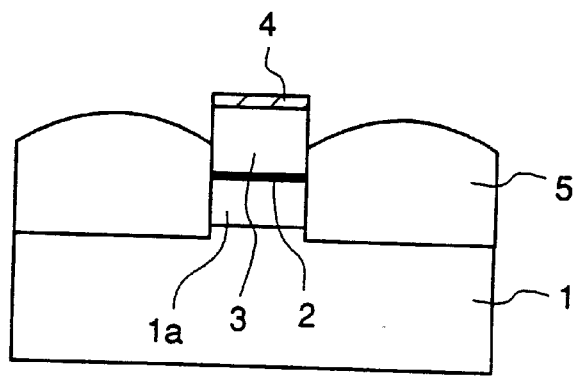
Figure 19:
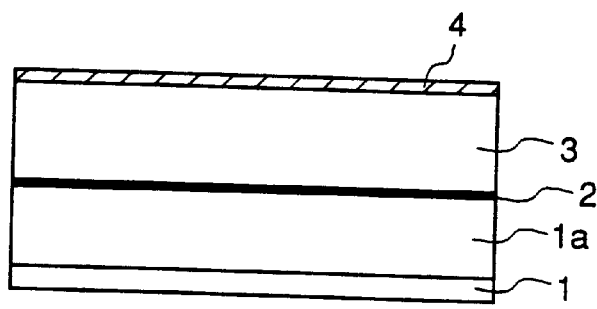
Figure 20:
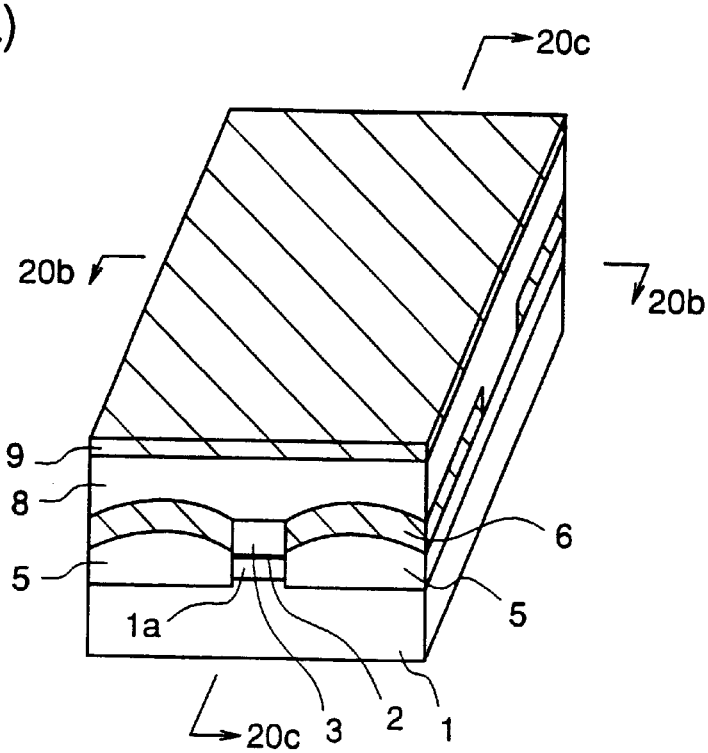
FIG. 20(a) is a perspective view illustrating a third step of the process for fabricating the semiconductor laser device according to the third embodiment.
FIGS. 20(b) and 20(c) are cross-sectional views taken along lines 20b—20b and 20c—20c of FIG. 20(a), respectively.
Figure 20:
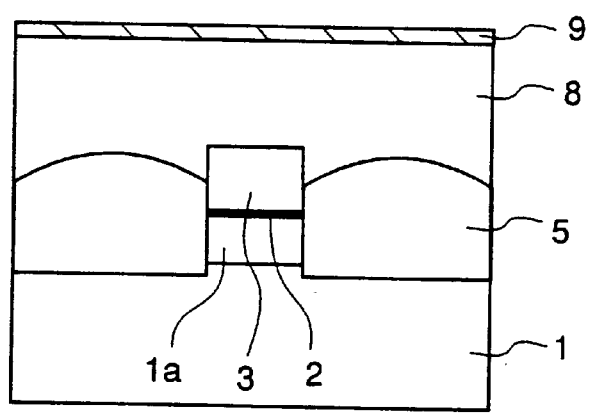
Figure 20:
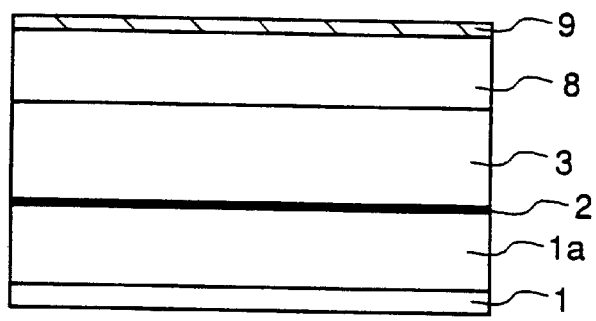

FIGS. 18(a)–18(c), 19(a)–19(c), and 20(a)–20(c) are diagrams illustrating first, second, and third process steps in the method for fabricating the device L, respectively. In these FIGS. 18(a), 19(a), and 20(a) are perspective views, 18(b), 19(b), and 20(b) are cross-sectional views taken along lines 18b—18b, 19b—19b, and 20b—20b of the perspective views, respectively, and 18(c), 19(c), and 20(c) are cross-sectional views taken along lines 18c—18c, 19c—19c, and 20c—20c of the perspective views, respectively.

In the first step shown in FIGS. 18(a)–18(c), initially, a diffraction grating (not shown) is formed on a region of the n type InP semiconductor substrate 1 where a semiconductor laser is later fabricated (region I).

Thereafter, an n type InP cladding layer 1a, an active layer 2, and a p type InP cladding layer 3 are successively grown by crystal growth, preferably MOCVD. The active layer 2 is an InGaAs/InGaAsP multiple quantum well (MQW) layer or a single InGaAs layer. Then, a stripe-shaped insulating film 4 having a width W of 1~2 μm is formed on the active layer 2. Using the insulating film 4 as a mask, dry etching is carried out to form a mesa structure M having a height of 2~3 μm, whereby an optical waveguide is fabricated.

Thereafter, using the insulating film 4 as a mask for selective growth, an Fe-doped InP semi-insulating semiconductor layer 5 and an n type InGaAsP hole trapping layer 6 are grown on both sides of the mesa structure M, preferably by MOCVD, to bury the mesa structure M in these layers. The composition of the InGaAsP hole trapping layer 6 is selected so that it lattice matches with InP and has a band gap wavelength $\lambda_g$ of 0.92~1.67 μm (preferably, $\lambda_g$=1.05~1.18 μm). To employ InGaAsP having a band gap wavelength $\lambda_g$ of 1.05~1.18 μm for the hole trapping layer secures a sufficiently large difference in etching rates between the InP and the InGaAsP, resulting in a satisfactory etching process.

In place of InGaAsP, n type InAlAs may be employed for the hole trapping layer 6. In this case, the composition of the InAlAs hole trapping layer 6 is selected so that it lattice matches with InP and has a band gap wavelength $\lambda_g$ of 0.86 μm. Also in this case, a sufficiently large difference is secured in etching rates between the InP and the InAlAs, resulting in a satisfactory etching process.

Next, in the second step shown in FIGS. 19(a)–19(c), a portion of the hole trapping layer 6, corresponding to the isolation part (region II) that separates the modulator (region III) and the laser (region I), is removed by dry etching. To be specific, photolithography is performed with the insulating film 4, and a portion of the hole trapping layer 6 corresponding to the isolation part is removed.

In this third embodiment, since Fe-doped InP is employed for the semi-insulating semiconductor layer 5 and n type InGaAsP is employed for the hole trapping layer 6, only the hole trapping layer 6 can be selectively and accurately etched and removed due to a difference in compositions between the semiconductor layer 5 and the hole trapping layer 6, with no necessity of using an etch stopping layer. The length of the portion to be etched is 10~50 μm as described for the first embodiment.

In the third step shown in FIGS. 20(a)–20(c), after removal of the insulating film 4, a p type InP cladding layer 8 and a p type InGaAs contact layer 9 are grown by crystal growth. Next, a portion of the contact layer 9 corresponding to the isolation part (region II) is removed. The range of this removal is 10~50 μm along the longitudinal direction of the mesa structure M (20c—20c direction of FIG. 20(a)). Then, as shown in FIGS. 17(a)–17(c), an insulating film 10 is formed on the contact layer 9, and portions of the insulating film 10 in regions where electrodes are to be fabricated are removed. Finally, electrodes 11 are fabricated in contact with the contact layer 9, completing the device L.

As described above, in the device L according to the third embodiment of the invention, since the low-resistance hole trapping layer 6 is discontinuous, i.e., absent, in the isolation part (region II), it is possible to prevent a high-frequency signal applied to the modulator (region III) from flowing through the hole trapping layer 6 into the laser (region I). Therefore, isolation between the laser and the modulator is increased, providing a device L with improved efficiency and stable performance. In addition, since the etch stopping layer 7, which is needed for the first embodiment when the hole trapping layer 6 is etched, can be dispensed with, the fabrication process is simplified.

Figure 21:
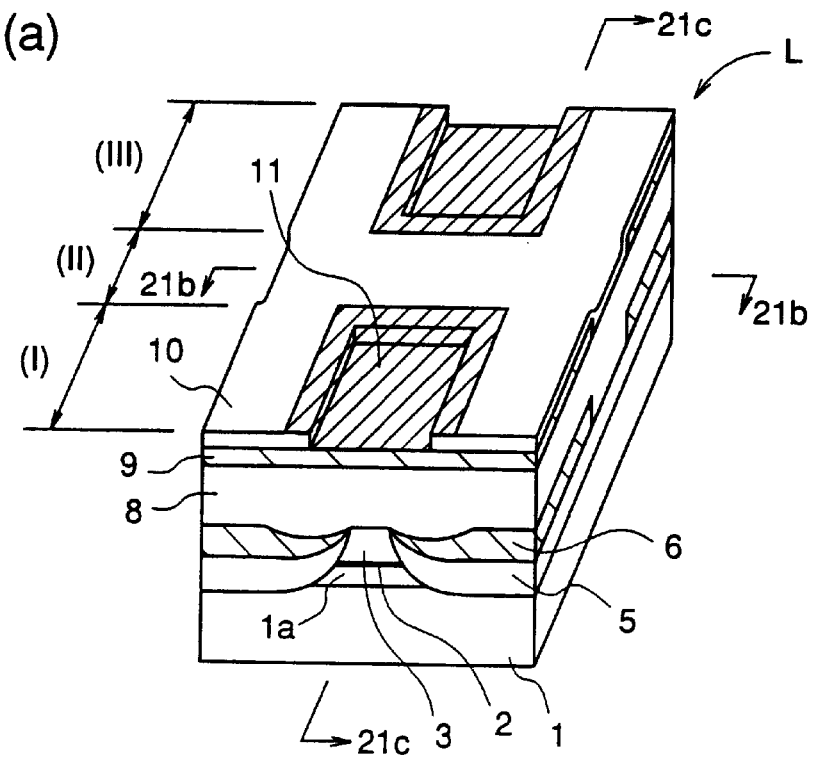
FIG. 21(a) is a perspective view illustrating a semiconductor laser device according to a modification of the third embodiment.
FIGS. 21(b) and 21(c) are cross-sectional views taken along lines 21b—21b and 21c—21c of FIG. 21(a), respectively.
Figure 21:
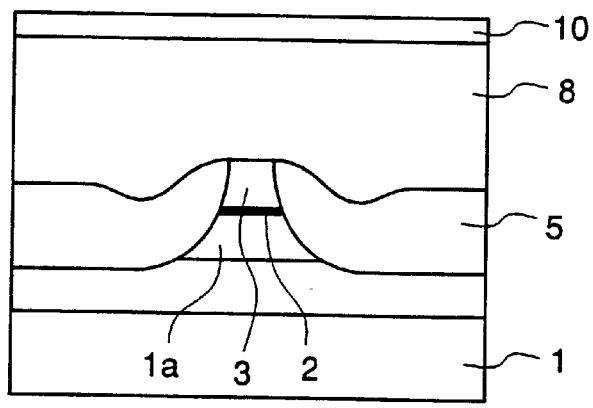
Figure 21:
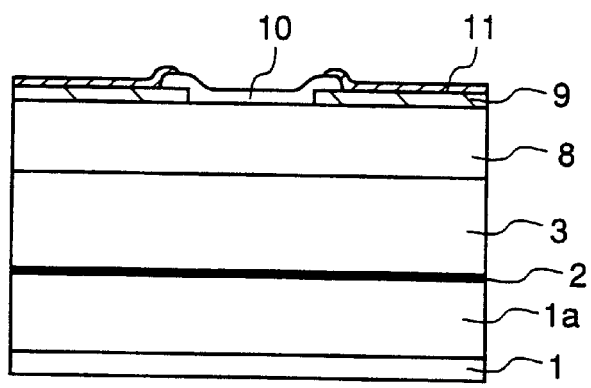
Figure 22:
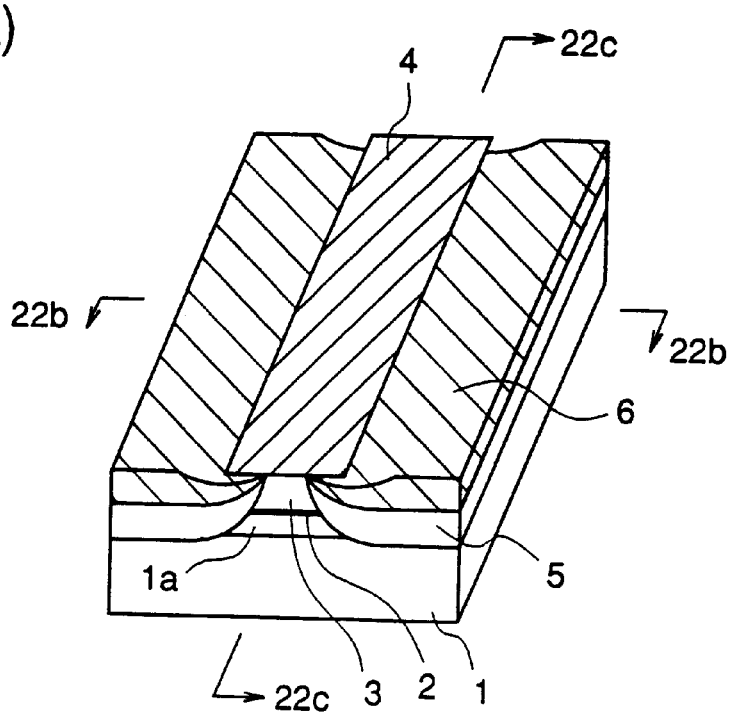
FIG. 22(a) is a perspective view illustrating a first step of a process for fabricating the semiconductor laser device according to the modification of the third embodiment.
FIGS. 22(b) and 22(c) are cross-sectional views taken along lines 22b—22b and 22c—22c of FIG. 22(a), respectively.
Figure 22:
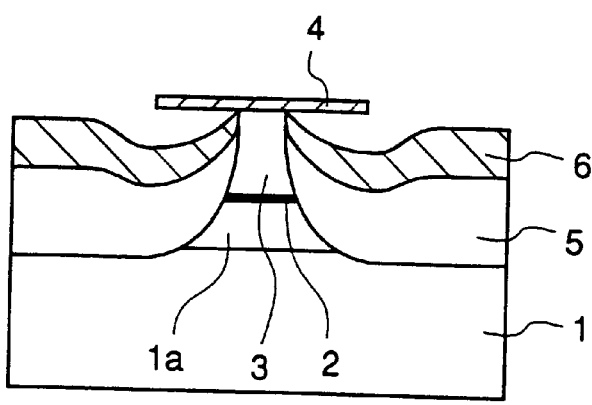
Figure 22:
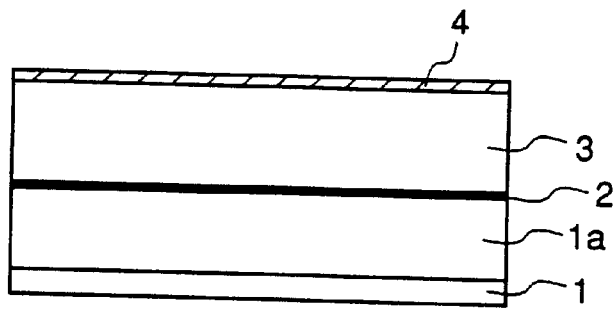
Figure 23:
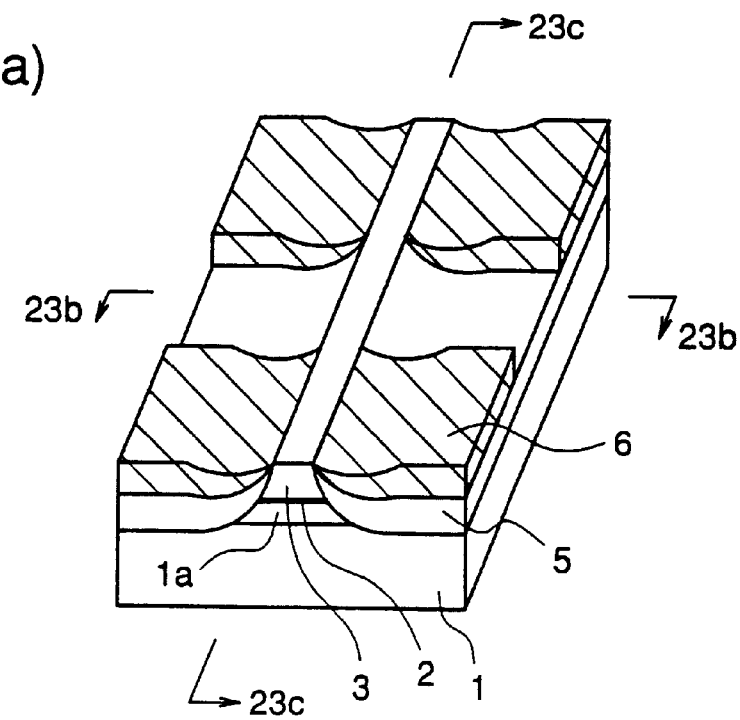
FIG. 23(a) is a perspective view illustrating a second step of the process for fabricating the semiconductor laser device according to the modification of the third embodiment.
FIGS. 23(b) and 23(c) are cross-sectional views taken along lines 23b—23b and 23c—23c of FIG. 23(a), respectively.
Figure 23:
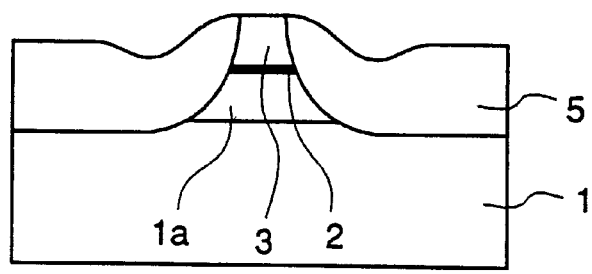
Figure 23:
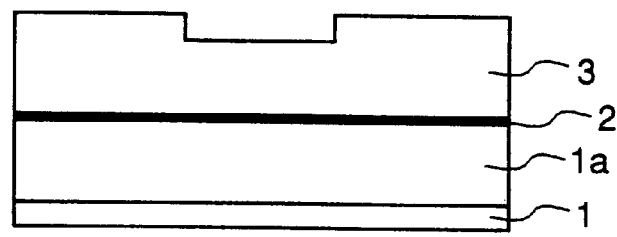
Figure 24:
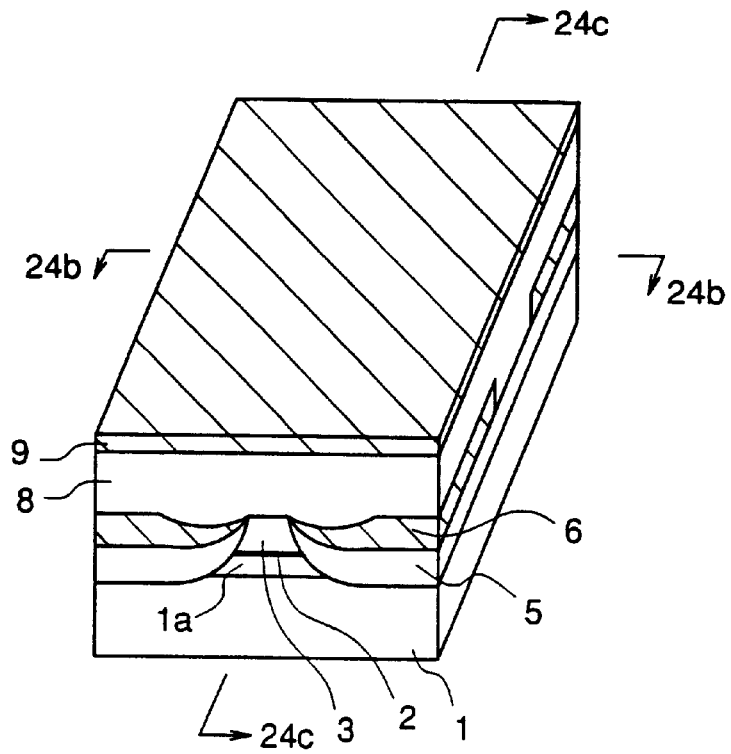
FIG. 24(a) is a perspective view illustrating a third step of the process for fabricating the semiconductor laser device according to the modification of the third modification.
FIGS. 24(b) and 24(c) are cross-sectional views taken along lines 24b—24b and 24c—24c of FIG. 24(a), respectively.
Figure 24:
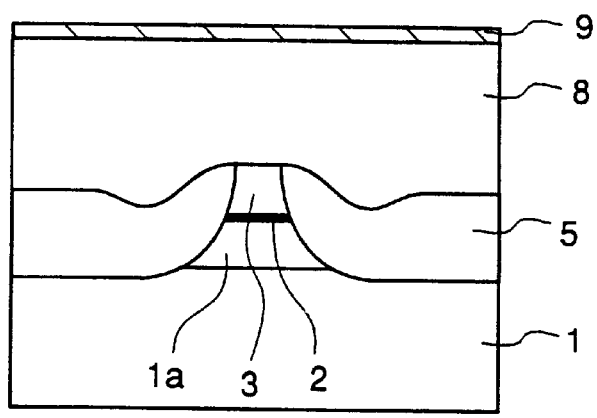
Figure 24:
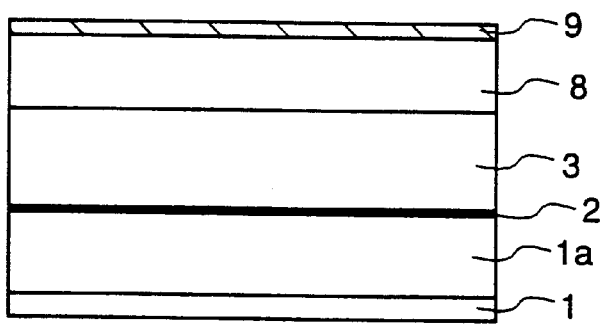

FIG. 21(a) is a perspective view illustrating a device L in which a mesa structure M is fabricated by wet etching, according to a modification of the third embodiment, and FIGS. 21(b) and 21(c) are cross-sectional views taken along lines 21b—21b and 21c—21c of FIG. 21(a), respectively. Furthermore, FIGS. 22(a)–22(c), 23(a)–23(c), and 24(a)–24(c) are diagrams illustrating first, second, and third process steps in a method for fabricating the device L according to the modification, respectively. In these FIGS. 22(a), 23(a), and 24(a) are perspective views, 22(b), 23(b), and 24(b) are cross-sectional views taken along lines 22b—22b, 23b—23b, and 24b—24b of the perspective views, respectively, and 22(c), 23(c), and 24(c) are cross-sectional views taken along lines 22c—22c, 23c—23c, and 24c—24c of the perspective views, respectively.

The fabrication method of the device L using wet etching in formation of the mesa structure M is different from the fabrication method using dry etching mentioned above, in the following respects.

① Since wet etching is isotropic, the width of the insulating film 4 is larger than that in dry etching.

② As shown in FIG. 23(b), when the hole trapping layer 6 is selectively etched, photolithography is carried out after removing the insulating film 4.

Further, in this modification of the third embodiment, the cap layer used for the modification of the first embodiment is dispensed with.

Other process steps are identical to those already described with respect to FIGS. 17(a)–17(c) to 20(a)–20(c) wherein the mesa structure M is formed by dry etching. Even when the mesa structure M is formed by wet etching as mentioned above, the same function and effect as those obtained in the case of employing dry etching are achieved. In this modification of the third embodiment, the same elements in FIGS. 21(a)–21(c) to 24(a)–24(c) that appear in FIGS. 17(a)–17(c) to 20(a)–20(c) are given the same reference numerals, and descriptions thereof are omitted.

[Embodiment 4]

Figure 25:
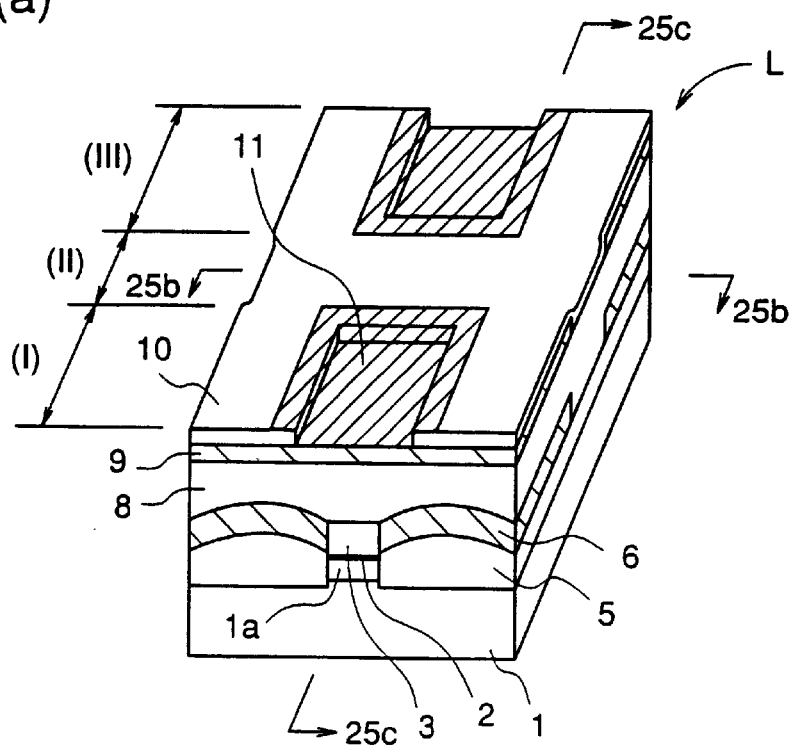
FIG. 25(a) is a perspective view illustrating a semiconductor laser device according to a fourth embodiment of the invention.
FIGS. 25(b) and 25(c) are cross-sectional views taken along lines 25b—25b and 25c—25c of FIG. 25(a), respectively.
Figure 25:
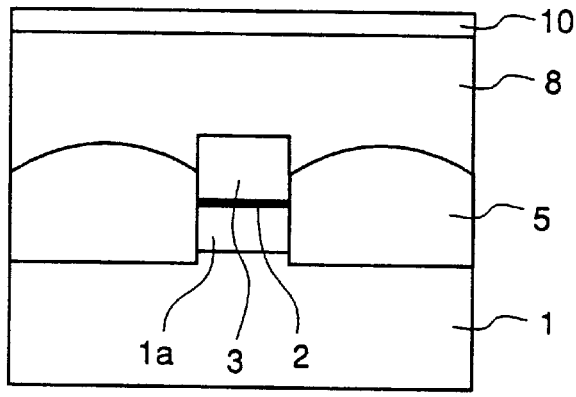
Figure 25:
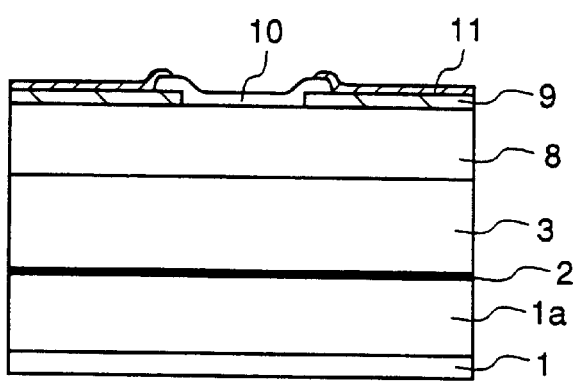

FIG. 25(a) is a perspective view illustrating a device L according to a fourth embodiment of the invention, and FIGS. 25(b) and 25(c) are cross-sectional views taken along lines 25b—25b and 25c—25c of FIG. 25(a), respectively.

With reference to these figures, the structure of the device L is fundamentally identical to the structure according to the first embodiment, that is, the device L comprises a semiconductor laser (region I) having a diffraction grating (not shown) on a region of a semiconductor substrate 1 beneath an active layer 2, a modulator (region III), and an isolation part (region II) separating the laser from the modulator.

More specifically, the device L has a mesa structure M (optical waveguide) comprising the active layer 2, an n type InP cladding layer 1a, and a p type InP cladding layer 3, on the n type InP substrate 1. On both sides of the mesa structure M, Fe-doped InP semi-insulating semiconductor layers 5 and n type InP hole trapping layers 6 are successively disposed. A p type InP cladding layer 8 is disposed on the mesa structure M, on the semi-insulating semiconductor layers 5, and on the hole trapping layers 6, and a p type InGaAs contact layer 9 is disposed on the cladding layer 8. An insulating film 10 and electrodes 11 are disposed on the contact layer 9.

The characteristics of this fourth embodiment are as follows:

① The hole trapping layer 6 is discontinuous, i.e., absent, in the middle of the structure along the longitudinal direction of the mesa structure M.

② As described later for the fabrication process of the device L, to form such a discontinuous hole trapping layer 6, it is selectively grown on separated portions of the semi-insulating semiconductor layer 5.

The dimensions of the components of the device L are as follows. The thickness of the semi-insulating semiconductor layer 5 is 3 μm, the thickness of the hole trapping layer 6 is 0.5 μm, and the thickness of the cladding layer 8 is 2~3 μm. Further, the width $M_w$ of the mesa structure M is about 1 μm. The height h of the device L is about 100 μm.

The operation of the device L according to this fourth embodiment is identical to that already described for the first, second, and third embodiments and, therefore, does not require repeated description.

A description is given of a method for fabricating the device L according to this fourth embodiment.

Figure 26:
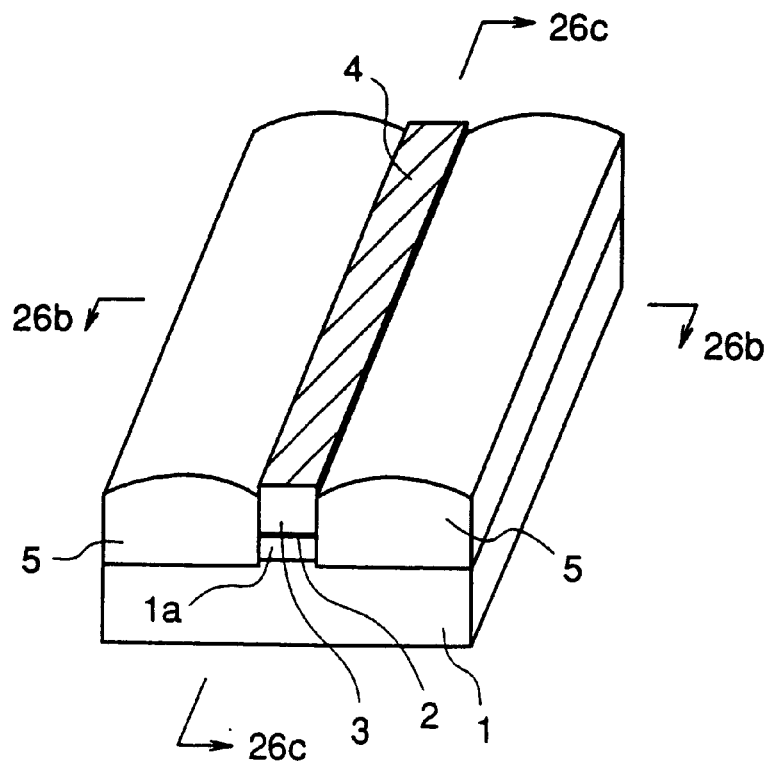
FIG. 26(a) is a perspective view illustrating a first step of a process for fabricating the semiconductor laser device according to the fourth embodiment.
FIGS. 26(b) and 26(c) are cross-sectional views taken along lines 26b—26b and 26c—26c of FIG. 26(a), respectively.
Figure 26:
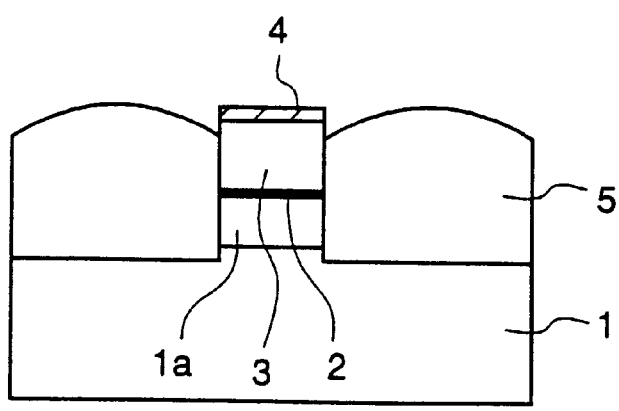
Figure 26:
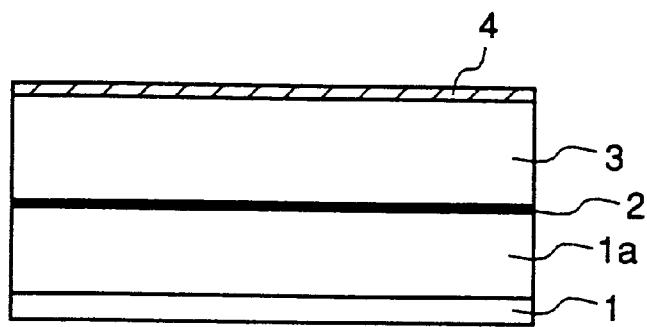
Figure 27:
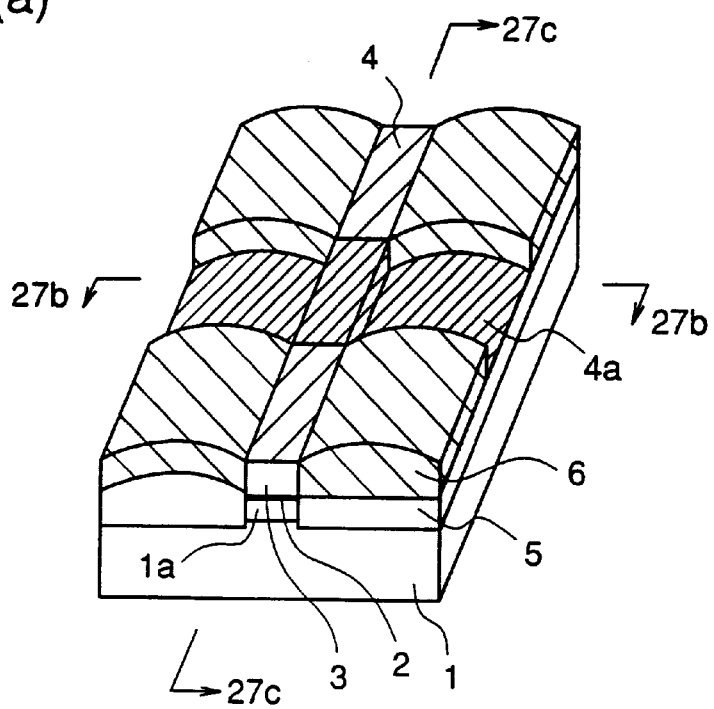
FIG. 27(a) is a perspective view illustrating a second step of the process for fabricating the semiconductor laser device according to the fourth embodiment.
FIGS. 27(b) and 27(c) are cross-sectional views taken along lines 27b—27b and 27c—27c of FIG. 27(a), respectively.
Figure 27:
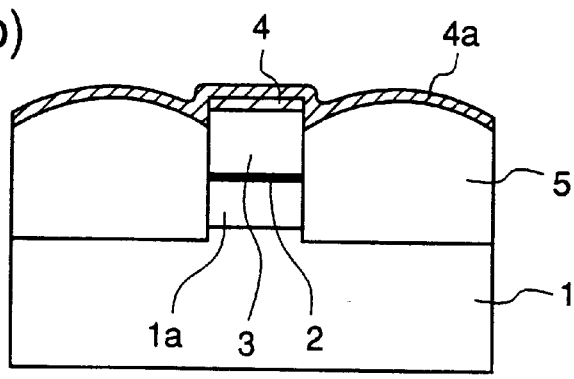
Figure 27:
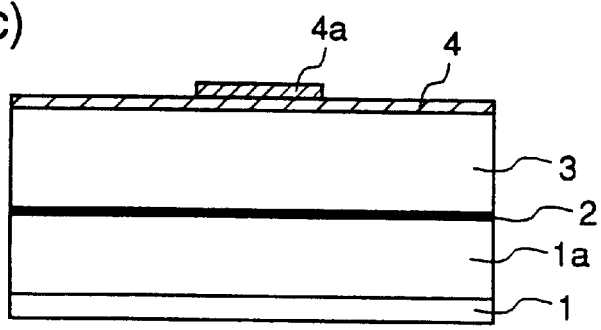
Figure 28:
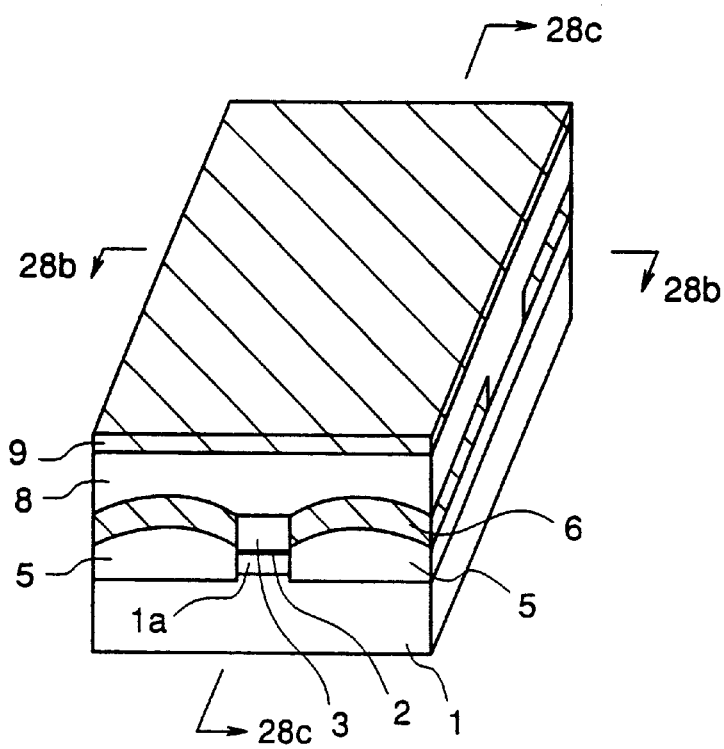
FIG. 28(a) is a perspective view illustrating a third step of the process for fabricating the semiconductor laser device according to the fourth embodiment.
FIGS. 28(b) and 28(c) are cross-sectional views taken along lines 28b—28b and 28c—28c of FIG. 28(a), respectively.
Figure 28:
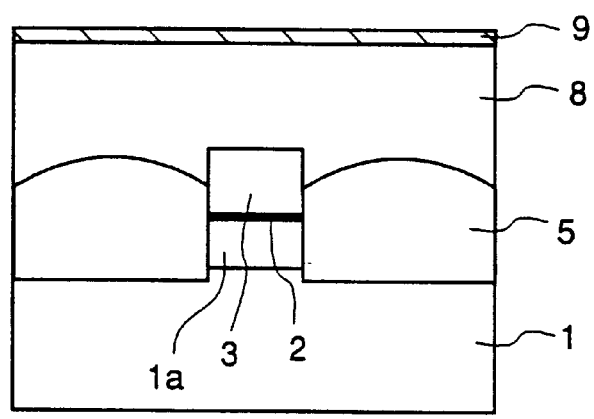
Figure 28:
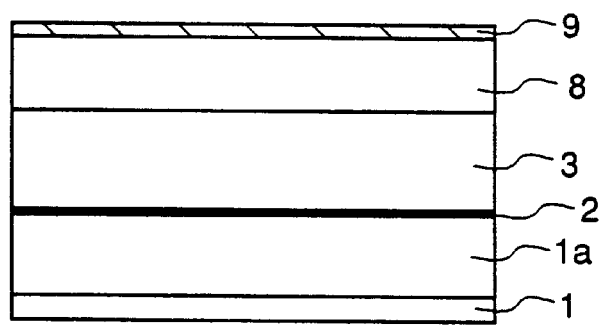

FIGS. 26(a)–26(c), 27(a)–27(c), and 28(a)–28(c) are diagrams illustrating first, second, and third process steps in the method for fabricating the device L, respectively. In these FIGS. 26(a), 27(a), and 28(a) are perspective views, 26(b), 27(b), and 28(b) are cross-sectional views taken along lines 26b—26b, 27b—27b, and 28b—28b of the perspective views, respectively, and 26(c), 27(c), and 28(c) are cross-sectional views taken along lines 26c—26c, 27c—27c, and 28c—28c of the perspective views, respectively.

In the first step shown in FIGS. 26(a)–26(c), initially, a diffraction grating (not shown) is formed on a region of the n type InP semiconductor substrate 1 where a semiconductor laser is later fabricated (region I). Thereafter, an n type InP cladding layer 1a, an active layer 2, and a p type InP cladding layer 3 are successively grown by crystal growth, preferably MOCVD. The active layer 2 is an InGaAs/InGaAsP multiple quantum well (MQW) layer or a single InGaAs layer. Then, a stripe-shaped insulating film 4 having a width W of 1~2 μm is formed on the active layer 2. Using the insulating film 4 as a mask, dry etching is carried out to form a mesa structure M having a height of 2~3 μm, whereby an optical waveguide is fabricated.

Thereafter, using the insulating film 4 as a mask for selective growth, an Fe-doped InP semi-insulating semiconductor layer 5 is grown on the substrate 1, contacting both sides of the mesa structure M, preferably by MOCVD.

In the second step shown in FIGS. 27(a)–27(c), an insulating film 4a is additionally formed on a region corresponding to the isolation part (region II), preferably by a lift-off technique. Thereafter, using the insulating film 4a as a mask for selective growth, an n type InP hole trapping layer 6 is grown. The size of the insulating film 4a in the isolation part (region II), i.e., along the 27c—27c direction, is 10~50 μm.

Next, in the third step shown in FIGS. 28(a)–28(c), after removal of the insulating films 4 and 4a by etching, a p type InP cladding layer 8 and a p type InGaAs contact layer 9 are grown by crystal growth. Next, a portion of the contact layer 9 corresponding to the isolation part (region II) is removed. The range of this removal is 10~50 μg m along the longitudinal direction of the mesa structure M (28c—28c direction in FIG. 28(a)). Then, as shown in FIGS. 25(a)–25(c), an insulating film 10 is formed on the contact layer 9, and portions of the insulating film 10 in regions where electrodes are to be fabricated are removed. Finally, electrodes 11 are produced in contact with the contact layer 9, completing the device L.

As described above, in the device L according to the fourth embodiment of the invention, since the low-resistance hole trapping layer 6 is discontinuous, i.e., absent, in the isolation part (region II), it is possible to prevent a high-frequency signal applied to the modulator (region III) from flowing through the hole trapping layer 6 into the laser (region I). Therefore, isolation between the laser and the modulator is increased, resulting in a device L with improved efficiency and stable performance.

Figure 29:
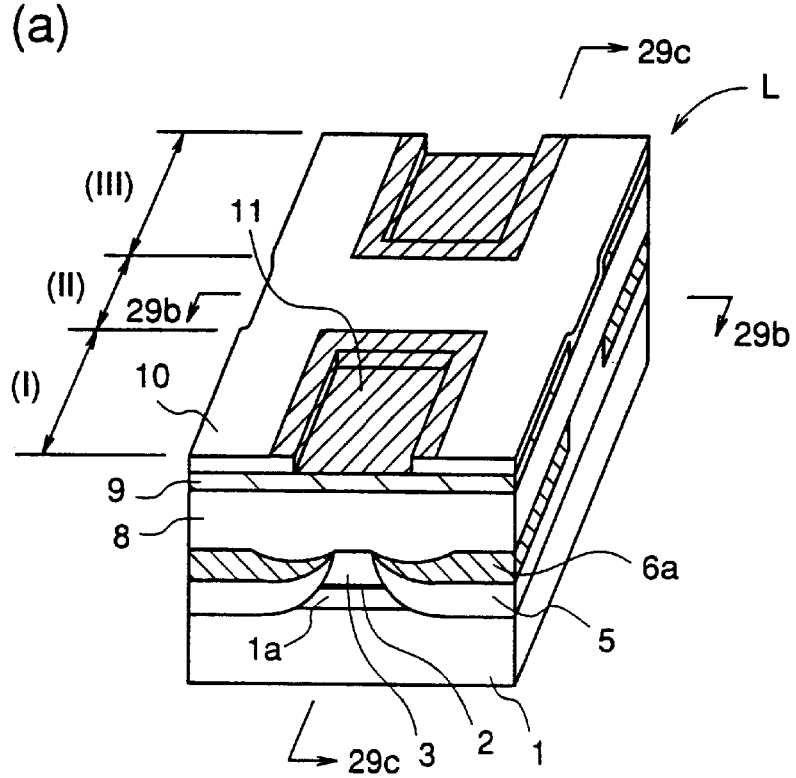
FIG. 29(a) is a perspective view illustrating a semiconductor laser device according to a modification of the fourth embodiment.
FIGS. 29(b) and 29(c) are cross-sectional views taken along lines 29b—29b and 29c—29c of FIG. 29(a), respectively.
Figure 29:
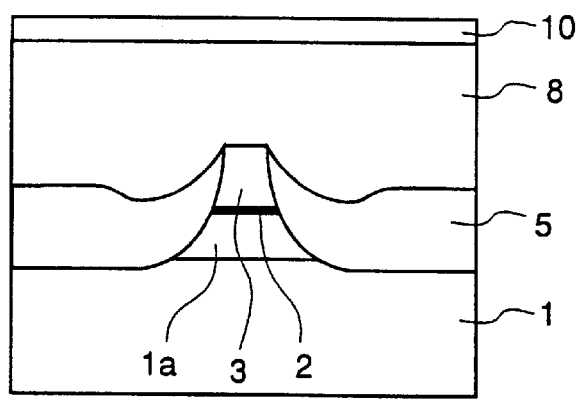
Figure 29:
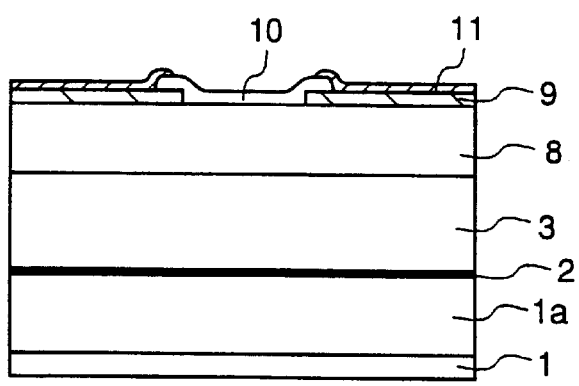
Figure 30:
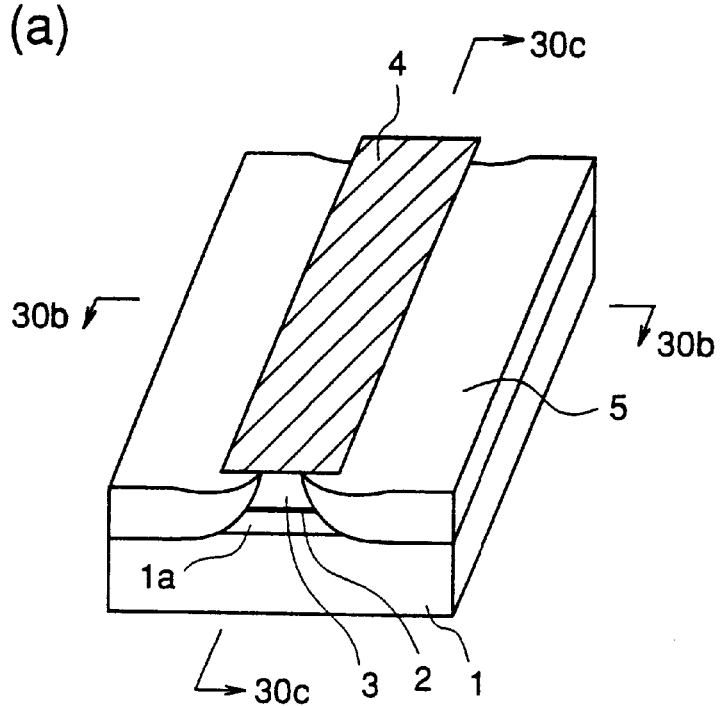
FIG. 30(a) is a perspective view illustrating a first step of a process for fabricating the semiconductor laser device according to the modification of fourth embodiment.
FIGS. 30(b) and 30(c) are cross-sectional views taken along lines 30b—30b and 30c—30c of FIG. 30(a), respectively.
Figure 30:
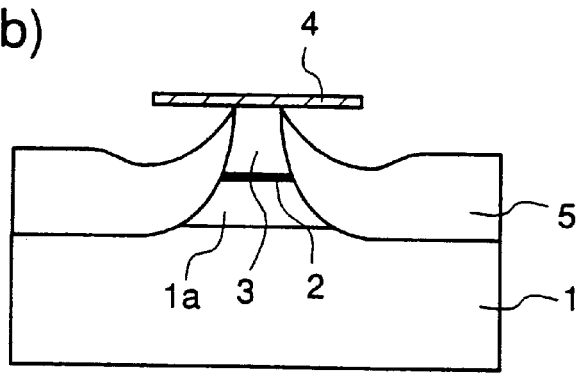
Figure 30:
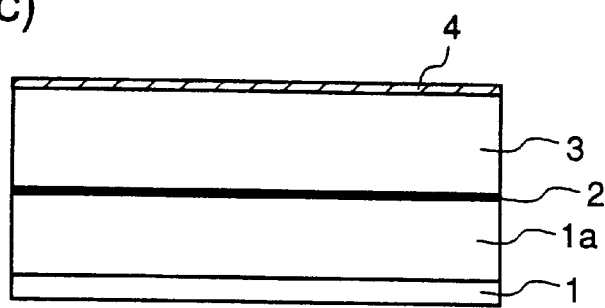
Figure 31:
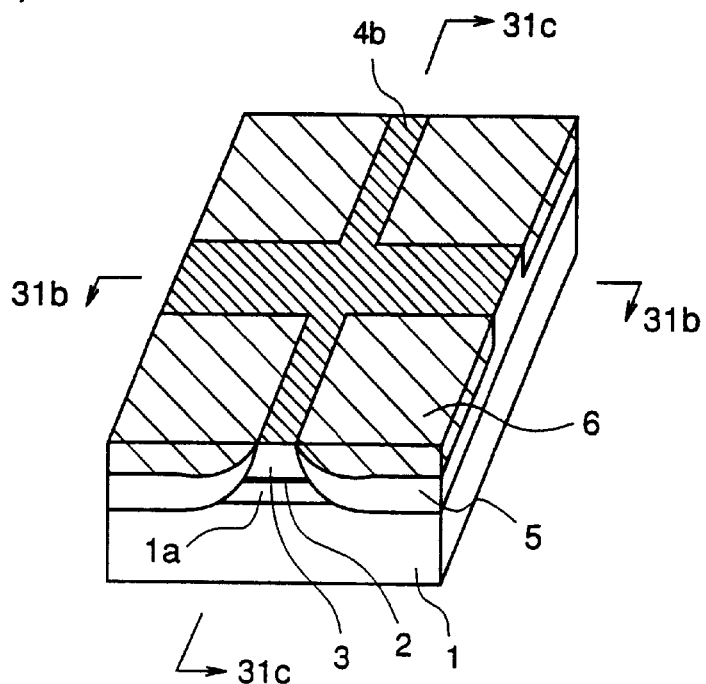
FIG. 31(a) is a perspective view illustrating a second step of the process for fabricating the semiconductor laser device according to the modification of the fourth embodiment.
FIGS. 31(b) and 31(c) are cross-sectional views taken along lines 31b—31b and 31c—31c of FIG. 31(a), respectively.
Figure 31:
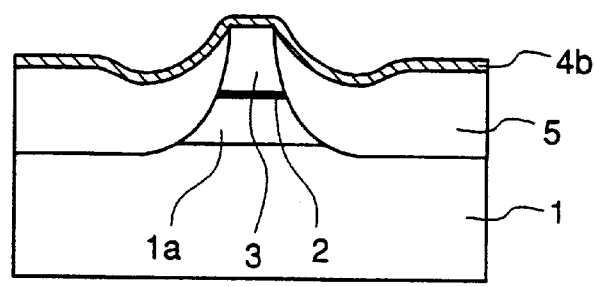
Figure 31:
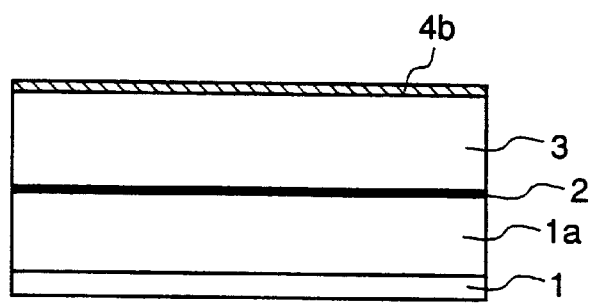
Figure 32:
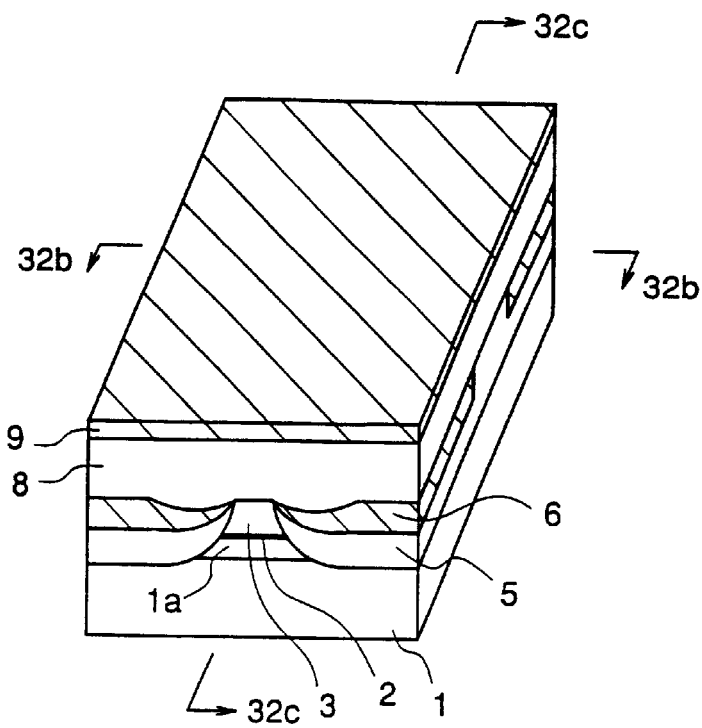
FIG. 32(a) is a perspective view illustrating a third step of the process for fabricating the semiconductor laser device according to the modification of the fourth embodiment.
FIGS. 32(b) and 32(c) are cross-sectional views taken along lines 32b—32b and 32c—32c of FIG. 32(a), respectively.
Figure 32:
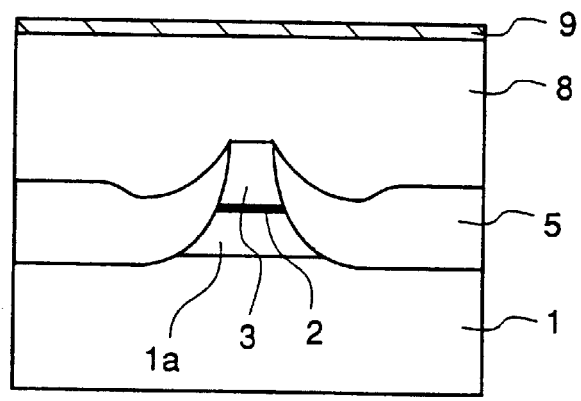
Figure 32:
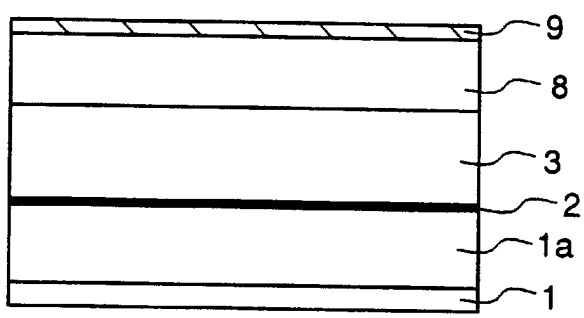

FIG. 29(a) is a perspective view illustrating a device L in which a mesa structure M is fabricated by wet etching, according to a modification of the fourth embodiment, and FIGS. 29(b) and 29(c) are cross-sectional views taken along lines 29b—29b and 29c—29c of FIG. 29(a), respectively. Furthermore, FIGS. 30(a)–30(c), 31(a)–31(c), and 32(a)–32(c) are diagrams illustrating first, second, and third process steps in a method for fabricating the device L according to the modification, respectively. In these FIGS. 30(a), 31(a), and 32(a) are perspective views, 30(b), 31(b), and 32(b) are cross-sectional views taken along lines 30b—30b, 31b—31b, and 32b—32b of the perspective views, respectively, and 30(c), 31(c), and 32(c) are cross-sectional views taken along lines 30c—30c, 31c—31c, and 32c—32c of the perspective views, respectively.

The fabrication method of the device L using wet etching in fabrication of the mesa structure M is different from the fabrication method using dry etching, in the following respects.

① Since wet etching is isotropic, the width of the insulating film 4 is larger than that in dry etching.

② As shown in FIG. 31(a), when the hole trapping layer 6 is selectively grown, a new insulating film 4b is formed and the selective growth is carried out using the insulating film 4b as a mask. More specifically, as shown in FIGS. 30(a)–30(c), after the growth of the semi-insulating semiconductor layer 5, the insulating film 4 is removed. Then, as shown in FIGS. 31(a)–31(c), a cross-shaped insulating film 4b is formed, followed by crystal growth of the hole trapping layer 6.

Other process steps are identical to those already described with respect to FIGS. 25(a)–25(c) to 28(a)–28(c) wherein the mesa structure M is formed by dry etching. Even when the mesa structure M is formed by wet etching as mentioned above, the same function and effect as those obtained in the case of employing dry etching are achieved. In this modification of the fourth embodiment, the same elements in FIGS. 29(a)–29(c) to 32(a)–32(c) that appear in FIGS. 25(a)–25(c) to 28(a)–28(c) are given the same reference numerals, so descriptions thereof are omitted.

While in the aforementioned embodiments Fe-doped InP is employed as a material of the semi-insulating semiconductor layer 5, Ti-doped InP, Co-doped InP, or undoped AlInAs can be employed.

What is claimed is:

1. A semiconductor laser device including:

a compound semiconductor substrate;

a semiconductor laser emitting laser light and a light modulator modulating the laser light, integrated on the compound semiconductor substrate and including a common mesa structure containing an active layer and extending through the semiconductor laser and the light modulator integrated on the semiconductor substrate; and a current blocking structure disposed on the semiconductor substrate on opposite sides of and contacting the common mesa structure, the current blocking structure including a semi-insulating semiconductor layer extending continuously along the common mesa of the semiconductor laser and the light modulator, an n type semiconductor layer covering the semi-insulating semiconductor layer, the n type semiconductor layer having a first region adjacent the common mesa structure at the semiconductor laser and a second region adjacent the common mesa structure at the light modulator, the first and second regions of the n type semiconductor layer being discontinuous from each other between the semiconductor laser and the light modulator, and an intervening layer having an energy band gap larger than that of the n type semiconductor layer, the intervening layer extending continuously through the semiconductor laser and the light modulator and supporting the n type semiconductor layer.

2. The semiconductor laser device of claim 1 wherein the semi-insulating semiconductor layer comprises InP, and the semiconductor layer comprises InAlAs that lattice matches with the InP.

3. The semiconductor laser device of claim 1 wherein the semi-insulating semiconductor layer comprises InP, and the semiconductor layer comprises InGaAsP that lattice matches with the InP.

4. A semiconductor laser device including:

a compound semiconductor substrate;

a semiconductor laser emitting laser light and a light modulator modulating the laser light, integrated on the compound semiconductor substrate and including a common mesa structure containing an active layer and extending through the semiconductor laser and the light modulator integrated on the semiconductor substrate; and a current blocking structure disposed on the semiconductor substrate on opposite sides of and contacting the common mesa structure, the current blocking structure including a semi-insulating semiconductor layer extending continuously along the common mesa of the semiconductor laser and the light modulator, and a n type semiconductor layer disposed directly on and covering the semi-insulating semiconductor layer, the n type semiconductor layer having a first region adjacent the common mesa structure at the semiconductor laser and a second region adjacent the common mesa structure at the light modulator, the first and second regions of the n type semiconductor layer being discontinuous from each other between the semiconductor laser and the light modulator.

5. The semiconductor laser device of claim 4 wherein the semi-insulating semiconductor layer comprises InP, and the semiconductor layer comprises InAlAs that lattice matches with the InP.

6. The semiconductor laser device of claim 4 wherein the semi-insulating semiconductor layer comprises InP, and the semicondutor layer comprises InGaAsP that lattice matches with the InP.

* * * * *